(12) United States Patent
Jung et al.

(10) Patent No.: US 11,802,242 B2
(45) Date of Patent: Oct. 31, 2023

(54) QUANTUM ROD, AND LIGHT-EMITTING DEVICE, OPTICAL MEMBER, AND APPARATUS, INCLUDING THE SAME

(71) Applicant: Samsung Display Co., Ltd., Yongin-si (KR)

(72) Inventors: Yunku Jung, Yongin-si (KR); Jaehong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 17/334,563

(22) Filed: May 28, 2021

(65) Prior Publication Data

US 2021/0371750 A1     Dec. 2, 2021

(30) Foreign Application Priority Data

Jun. 1, 2020     (KR) ........................ 10-2020-0066022

(51) Int. Cl.
| | | |
|---|---|---|
| *C09K 19/12* | (2006.01) | |
| *G02F 1/13357* | (2006.01) | |
| *G02F 1/017* | (2006.01) | |
| *C09K 11/02* | (2006.01) | |
| *H10K 50/85* | (2023.01) | |
| *B82Y 20/00* | (2011.01) | |
| *B82Y 30/00* | (2011.01) | |
| *B82Y 40/00* | (2011.01) | |
| *H10K 101/30* | (2023.01) | |
| *H10K 102/00* | (2023.01) | |

(52) U.S. Cl.
CPC .............. *C09K 19/12* (2013.01); *C09K 11/02* (2013.01); *G02F 1/017* (2013.01); *G02F 1/1336* (2013.01); *H10K 50/85* (2023.02); *B82Y 20/00* (2013.01); *B82Y 30/00* (2013.01); *B82Y 40/00* (2013.01); *C09K 2019/122* (2013.01); *H10K 2101/30* (2023.02); *H10K 2102/331* (2023.02)

(58) Field of Classification Search
None
See application file for complete search history.

(56) References Cited

U.S. PATENT DOCUMENTS 10,174,249 B2     1/2019   Kim et al.

FOREIGN PATENT DOCUMENTS

| KR | 10-2014-0086058 A | 7/2014 |
| KR | 10-2017-0048311 A | 5/2017 |
| KR | 10-2018-0069687 A | 6/2018 |
| KR | 10-2018-0111260 A | 10/2018 |

OTHER PUBLICATIONS

Whi Dong Kim et al., Pushing the Efficiency Envelope for Semiconductor Nanocrystal-Based Electroluminescence Devices Using Anisotropic Nanocrystals, Chemistry of Materials, Apr. 22, 2019, pp. 3066-3082, vol. 31, ACS Publications, American Chemical Society.

(Continued)

*Primary Examiner* — Gregory D Clark
(74) *Attorney, Agent, or Firm* — Lewis Roca Rothgerber Christie LLP

(57) ABSTRACT

A quantum rod includes a nanoparticle, and at least one ligand linked to the surface of the nanoparticle and represented by Formula 1.

$$R_1\text{-}(L_1)_{b1}\text{-}(A_1)_{a1}\text{-}(L_2)_{b2}\text{-}(A_2)_{a2}\text{-}(L_3)_{b3}\text{-}T_1.$$   Formula 1

A light-emitting device, an optical member, and an apparatus, each includes the quantum rod.

20 Claims, 5 Drawing Sheets

(56) References Cited

OTHER PUBLICATIONS

Wiktor Lewandowski et al., Metal Nanoparticles with Liquid-Crystalline Ligands: Controlling Nanoparticle Superlattice Structure and Properties, ChemPhysChem Minireviews, 2014, pp. 1283-1295, vol. 15, Wiley-VCH Veriag GmbH & Co. KGaA, Weinheim, Germany.

Yorai Amit et al., Semiconductor nanorod layers aligned through mechanical rubbing, Phys. Status Solidi A, 2012, pp. 235-242, vol. 209, No. 2, WILEY-VCH Veriag GmbH & Co. KGaA, Weinheim, Germany.

Taejong Paik et al., Studies of Liquid Crystalline Self-Assembly of $GdF_3$ Nanoplates by In-Plane, Out-of-Plane SAXS, ACS Nano, Sep. 11, 2011, pp. 8322-8330, vol. 5 No. 10, American Chemical Society.

Luigi Carbone et al., Synthesis and Micrometer-Scale Assembly of Colloidal CdSe/CdS Nanorods Prepared by a Seeded Growth Approach, Nano Letters, 2007, pp. 2942-2950, vol. 7, No. 10, American Chemical Society.

X-AXIS : DISTANCE IN DEVICE ; Y-AXIS : CHARGE DENSITY

QUANTUM ROD, AND LIGHT-EMITTING DEVICE, OPTICAL MEMBER, AND APPARATUS, INCLUDING THE SAME

CROSS-REFERENCE TO RELATED APPLICATION

This application claims priority to and the benefit of Korean Patent Application No. 10-2020-0066022, filed on Jun. 1, 2020, in the Korean Intellectual Property Office, the disclosure of which is incorporated herein in its entirety by reference.

BACKGROUND

1. Field

One or more embodiments relate to a quantum rod, and a light-emitting device, an optical member, and an apparatus, each including the quantum rod.

2. Description of Related Art

Quantum dots are nanocrystals of semiconductor materials and exhibit a quantum confinement effect. When quantum dots reach an excited energy state by receiving light from an excitation source, they emit energy according to a corresponding energy band gap by themselves. In this regard, even in the case of the same material, the wavelength varies depending on the particle size, and accordingly, by adjusting the size of the quantum dots, light having the desired wavelength range may be obtained, and desired (e.g., excellent) color purity and high luminescence efficiency may be obtained. Thus, the quantum dots may be applicable to various suitable devices.

In addition, a quantum dot can be utilized as a material that performs various suitable optical functions (for example, a photo-conversion function) in optical members. Quantum dots, as nano-sized semiconductor nanocrystals, may have different energy band gaps by adjusting the size and composition of the nanocrystals, and thus may emit light of various suitable emission wavelengths.

An optical member including such quantum dots may have a thin-film shape, for example, a thin-film shape patterned for each subpixel. Such an optical member may be utilized as a color conversion member of a device including various suitable light sources.

However, quantum dots (nanoparticles) are mainly in the form of dots (e.g., three-dimensional particles), and, in order to improve the device efficiency by improving the out-coupling phenomenon, there is a need to develop nanoparticles in the form of rods or plates (for example, quantum rods) and arrange these nanoparticles in a desired orientation or alignment.

To evenly align quantum rods, a magnetic field may be applied (method A), a micro groove may be formed on a substrate (method B), or a method utilizing self assembly (method C), etc. may be utilized. However, in the case of method A, an electrode is separately inserted for in-plane orientation, and a very large electric field is required. In the case of method B, the degree of the orientation alignment is not high enough, and the groove causes a physical damage to the substrate and thus the device characteristics may deteriorate. In the case of method C, the time for alignment is long and the method cannot be applicable to a large device substrate.

SUMMARY

Aspects according to one or more embodiments are directed toward a device and an apparatus, each having enhanced stability, in which, when quantum rods including nanoparticles with liquid crystalline ligands introduced thereonto, are applied to a light-emitting device, the quantum rods are aligned with a high degree of in-plane orientation.

Additional aspects will be set forth in part in the description which follows and, in part, will be apparent from the description, or may be learned by practice of the presented embodiments of the disclosure.

According to one or more embodiments, a quantum rod includes a nanoparticle, and at least one liquid crystal ligand linked to the surface of the nanoparticle, the liquid crystal ligand is represented by Formula 1:

$$R_1\text{-}(L_1)_{b1}\text{-}(A_1)_{a1}\text{-}(L_2)_{b2}\text{-}(A_2)_{a2}\text{-}(L_3)_{b3}\text{-}T_1 \quad \text{Formula 1}$$

wherein, in Formula 1, $A_1$ and $A_2$ may each independently be a substituted or unsubstituted $C_3\text{-}C_{60}$ carbocyclic group or a substituted or unsubstituted $C_1\text{-}C_{60}$ heterocyclic group, a1 and a2 may each independently be an integer from 1 to 6, $L_1$ to $L_3$ may each independently be selected from *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S*', *—SCF$_2$*', *—(CH$_2$)$_{n1}$—*', *—CF$_2$CH$_2$—*', *—CH$_2$CF$_2$—*', *—(CF$_2$)$_{n1}$*', *—CH=CH—*', *—CF=CF—*', *—C≡C—*', *—CH=CH—C(=O)O—*', *—OC(=O)—CH=CH—*', *—C(Q$_1$)(Q$_2$)*', *—CH(—(S$_p$)$_{c1}$—P$_3$)—*', *—CH$_2$CH(—(S$_p$)$_{c1}$—P$_3$)*', *—CH(—(S$_p$)$_{c1}$—P$_3$)CH(—(S$_p$)$_{c2}$—P$_3$)—*', *—O—(CH$_2$)—O(C=O)—(CH$_2$)$_{n2}$—*', *—S(=O)(Q$_1$)-*', *—S(=O)$_2$—*', *—P(=O)(Q$_1$)-*', *—P(=O)$_2$—*', *—P(=S)(Q$_1$)-*', and *—P(=S)$_2$—*', b1 to b3 may each independently be an integer from 0 to 6, n1 may be an integer from 1 to 4, n2 may be an integer from 0 to 2, $S_p$ may be a spacer group or a single bond, c1 and c2 may each independently be an integer from 1 to 4, $R_1$ may be selected from *—(O—Si($R_a$)($R_b$))$_{d1}$—O—Si($R_c$)($R_d$)($R_e$), *—P(=O)(OR$_a$)$_2$, *—O(R$_a$), *—C(=O)(OR$_a$), *—S(R$_a$), and *—N(R$_a$)(R$_b$), $R_a$ to $R_e$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1\text{-}C_{60}$ alkyl group, a substituted or unsubstituted $C_2\text{-}C_{60}$ alkenyl group, a substituted or unsubstituted $C_2\text{-}C_{60}$ alkynyl group, and a substituted or unsubstituted $C_1\text{-}C_{60}$ alkoxy group, d1 may be an integer from 0 to 6, $T_1$ may be selected from a cyano group, a substituted or unsubstituted $C_1\text{-}C_{60}$ alkyl group, a substituted or unsubstituted $C_2\text{-}C_{60}$ alkenyl group, a substituted or unsubstituted $C_2\text{-}C_{60}$ alkynyl group, and a substituted or unsubstituted $C_1\text{-}C_{60}$ alkoxy group, and at least one substituent of the substituted $C_3\text{-}C_{60}$ carbocyclic group, the substituted $C_1\text{-}C_{60}$ heterocyclic group, the substituted $C_1\text{-}C_{60}$ alkyl group, the substituted $C_2\text{-}C_{60}$ alkenyl group, the substituted $C_2\text{-}C_{60}$ alkynyl group, and the substituted $C_1$-$C_{60}$ alkoxy group may be selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —NCO, —NCS, —OCN, —SCN, —C($=$O)N($Q_{11}$)$_2$, —Si($Q_{11}$)($Q_{12}$)($Q_{13}$), —N($Q_{11}$)($Q_{12}$), —B($Q_{11}$)($Q_{12}$), —C($=$O)($Q_{11}$), —S($=$O)$_2$($Q_{11}$), and —P($=$O)($Q_{11}$)($Q_{12}$), wherein $Q_1$ to $Q_2$ and $Q_{11}$ to $Q_{13}$ may each independently be selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to a neighboring atom.

According to one or more embodiments, a light-emitting device includes a first electrode;

a second electrode facing the first electrode; and an emission layer between the first electrode and the second electrode;

wherein the emission layer includes the quantum rod.

According to one or more embodiments, an optical member includes the quantum rod.

According to one or more embodiments, an apparatus includes the quantum rod.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
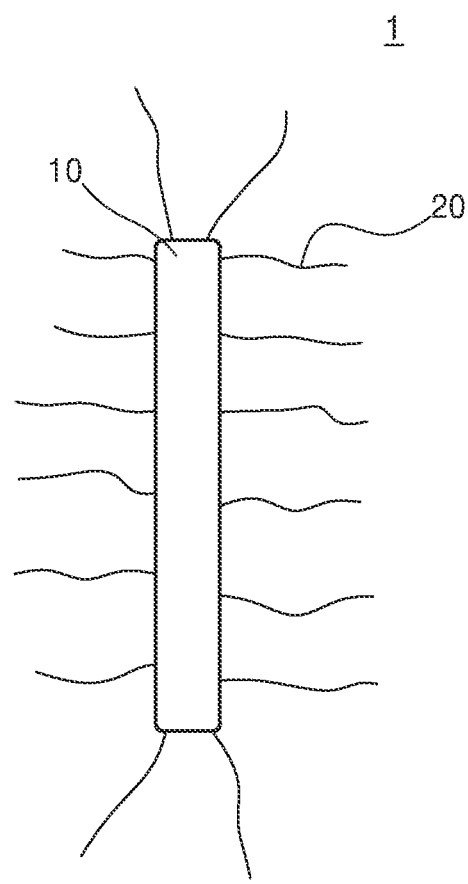
FIG. 1 is a schematic diagram schematically illustrating the structure of a quantum rod according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various suitable components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

In the following embodiments, when various suitable components such as layers, films, regions, plates, etc. are said to be "on" another component, this may include not only a case in which other components are "immediately on" the layers, films, regions, or plates, but also a case in which other components may be placed therebetween. Sizes of elements in the drawings may be exaggerated for convenience of explanation. In other words, because sizes and thicknesses of components in the drawings are arbitrarily illustrated for convenience of explanation, the following embodiments are not limited thereto.

[Quantum Rod]

FIG. 1 is a schematic diagram schematically illustrating the structure of a quantum rod 1 according to an embodiment.

Referring to FIG. 1, the quantum rod 1 includes a nanoparticle 10 and at least one liquid crystal ligand 20 linked to the surface of the nanoparticle 10, and the liquid crystal ligand is represented by Formula 1:

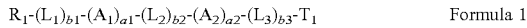

$$R_1\text{-}(L_1)_{b1}\text{-}(A_1)_{a1}\text{-}(L_2)_{b2}\text{-}(A_2)_{a2}\text{-}(L_3)_{b3}\text{-}T_1 \quad \quad \text{Formula 1}$$

wherein, in Formula 1, $A_1$ and $A_2$ may each independently be a substituted or unsubstituted $C_3$-$C_{60}$ carbocyclic group or a substituted or unsubstituted $C_1$-$C_{60}$ heterocyclic group.

For example, $A_1$ and $A_2$ may each independently be selected from a benzene group, a pentalene group, an indene group, a naphthalene group, an azulene group, a heptalene group, an indacene group, an acenaphthalene group, a fluorene group, a spiro-bifluorene group, a spiro-benzofluorenefluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group, each substituted with at least one selected from deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a pyridinyl group, a pyrazinyl group, a pyrimidinyl group, a pyridazinyl group, a quinolinyl group, an isoquinolinyl group, a benzofuranyl group, a benzothiophenyl group, —NCO, —NCS, —OCN, —SCN, —C(=O)N$(Q_{11})_2$, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, and —P(=O)$(Q_{11})(Q_{12})$, wherein $Q_{11}$ to $Q_{13}$ may each independently be selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

a1 and a2 in Formula 1 may each independently be an integer from 1 to 6.

a1 indicates the number of $A_1$(s) and a2 indicates the number of $A_2$(s), and when a1 is 2 or more, two or more $A_1$(s) may be identical to or different from each other, and when a2 is 2 or more, two or more $A_2$(s) may be identical to or different from each other.

For example, *-$(A_1)_{a1}$-*' and *-$(A_2)_{a2}$-*' may each independently be a group represented by one of Formulae A-1 to A-21:

A-1

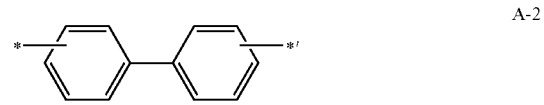

A-2

A-3

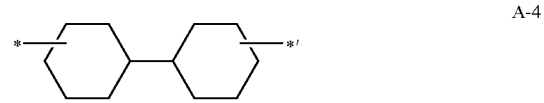

A-4

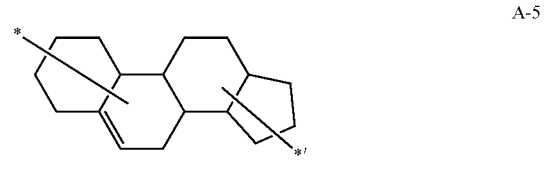

A-5

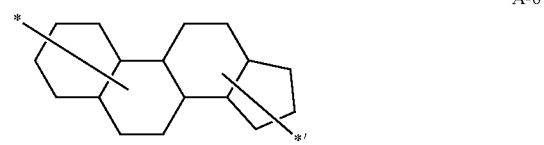

A-6

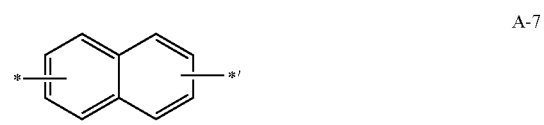

A-7

A-8

A-9

A-10

A-11

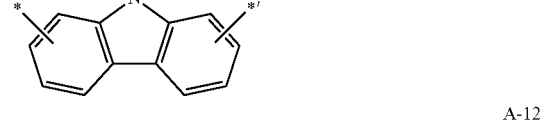

A-12

-continued

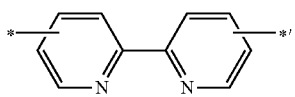
A-13

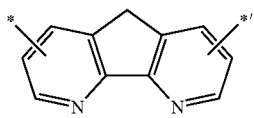
A-14

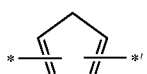
A-15

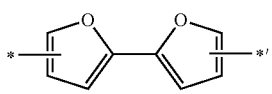
A-16

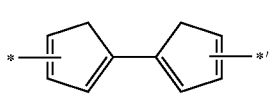
A-17

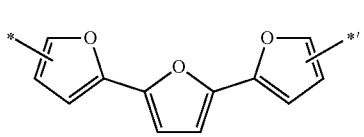
A-18

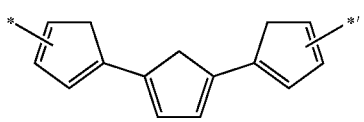
A-19

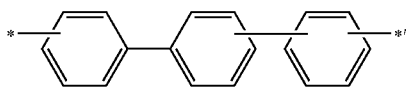
A-20

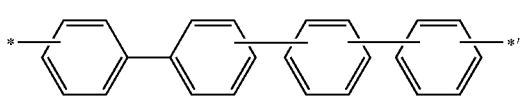
A-21 wherein, in Formulae A-1 to A-21,
* and *' each indicate a binding site to a neighboring atom.
$L_1$ to $L_3$ in Formula 1 may each independently be selected from *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S—*', *—SCF$_2$—*', *—(CH$_2$)$_{n1}$—*', *—CF$_2$CH$_2$—*', *—CH$_2$CF$_2$—*', *—(CF$_2$)$_{n1}$*', *—CH=CH*', *—CF=CF—*', *—C≡C*', *—CH=CH—C(=O)O—*', *—OC(=O)—CH=CH—*', *—C(Q$_1$)(Q$_2$)*', *—CH(—(S$_p$)$_{c1}$—P$_3$)—*', *—CH$_2$CH(—(S$_p$)$_{c1}$—P$_3$)—*', *—CH(—(S$_p$)$_{c1}$—P$_3$)CH(—(S$_p$)$_{c2}$—P$_3$)—*', *—O—(CH$_2$)—O(C=O)—(CH$_2$)$_{n2}$—*', *—S(=O)(Q$_1$)-*', *—S(=O)$_2$—*', *—P(=O)(Q$_1$)-*', *—P(=O)$_2$—*', *—P(=S)(Q$_1$)-*', and *—P(=S)$_2$—*',
b1 to b3 may each independently be an integer from 0 to 6, and
n1 may be an integer from 1 to 4, and n2 may be an integer from 0 to 2.
b1 to b3 each indicate numbers of $L_1$ to $L_3$, respectively, and when b1 is 2 or more, two or more of $L_1$(s) may be identical to or different from each other, when b2 is 2 or more, two or more of $L_2$(s) may be identical to or different from each other, when b3 is 2 or more, two or more of $L_3$(s) may be identical to or different from each other, when b1 is 0, -(L$_1$)$_{b1}$- may be a single bond, when b2 is 0, -(L$_2$)$_{b2}$- may be a single bond, and when b3 is 0, -(L$_3$)$_{b3}$- may be a single bond.

$S_p$ in Formula 1 may be a spacer group or a single bond.
In this regard, the spacer group may link $A_1$, which is a core group, with $R_1$, which is an anchoring group, or link $A_2$, which is a core group, with $T_1$, which is a terminal group.
For example, the spacer group may be selected from *—N(Q$_1$)-*', *—O—*', *—S—*', *—Si(Q$_1$)(Q$_2$)-*', a divalent C$_1$-C$_{20}$ alkyl group, and a divalent C$_1$-C$_{20}$ alkoxy group; and a divalent C$_1$-C$_{20}$ alkyl group and a divalent C$_1$-C$_{20}$ alkoxy group, each substituted with at least one selected from deuterium, —F, —Cl, —Br, —I, a hydroxyl group, a cyano group, a C$_1$-C$_{10}$ alkyl group, a C$_1$-C$_{10}$ alkoxy group, —NCO, —NCS, —OCN, and —SCN, $Q_1$ to $Q_2$ may each independently be selected from hydrogen, a C$_1$-C$_{20}$ alkyl group, a C$_1$-C$_{20}$ alkoxy group, a phenyl group, a biphenyl group, a terphenyl group, a naphthyl group, and a pyridinyl group, and
* and *' each indicate a binding site to a neighboring atom.

c1 and c2 in Formula 1 may each independently be an integer from 1 to 4.
Each of c1 and c2 may represent the number of $S_p$, and when c1 and/or c2 is 2 or more, two or more of $S_p$(s) may be identical to or different from each other.

For example, *-(L$_1$)$_{b1}$-*', *-(L$_2$)$_{b2}$-*', and *-(L$_3$)$_{b3}$-*' may each independently be a group represented by one of Formulae L-1 to L-64:

L-1

L-2

L-3

L-4

L-5

L-6

L-7

L-8

L-9

L-10

L-11

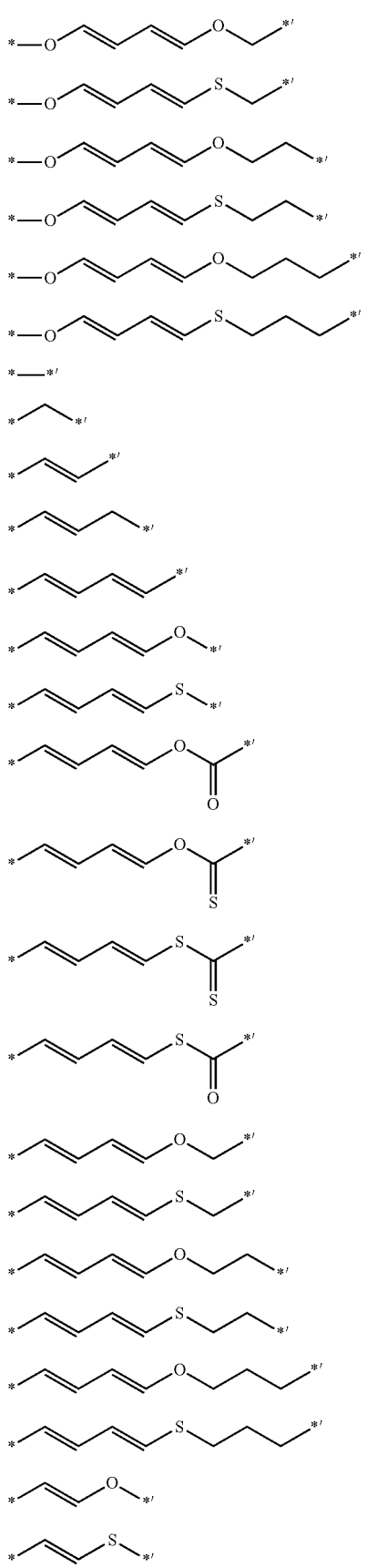
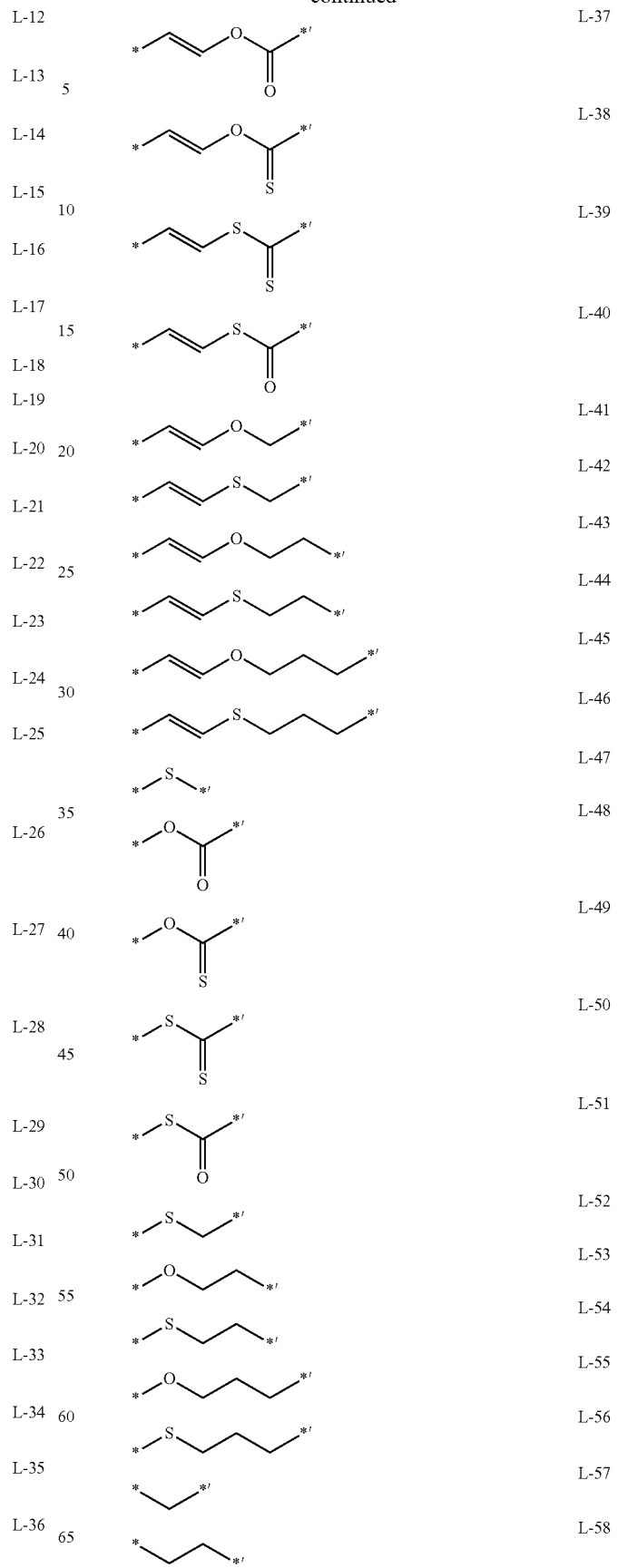

-continued

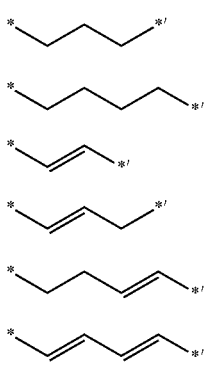

L-59

L-60

L-61

L-62

L-63

L-64 wherein, in Formulae L-1 to L-64,

\* and \*' each indicate a binding site to a neighboring atom.

$R_1$ in Formula 1 may be an anchoring group.

In this regard, the term "anchoring group" refers to a binding group that allows the liquid crystal ligand 20 to be adsorbed onto the nanoparticle 10 when the liquid crystal ligand 20 is coordinated with the nanoparticle 10.

$R_1$ in Formula 1 may be selected from *—(O—Si($R_a$)($R_b$))$_{d1}$—O—Si($R_c$)($R_d$)($R_e$), *—P(=O)(O$R_a$)$_2$, *—O($R_a$), *—C(=O)(O$R_a$), *—S($R_a$), and *—N($R_a$)($R_b$), $R_a$ to $R_e$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, and d1 may be an integer from 0 to 6.

For example, $R_1$ may be *—S($R_a$), $R_a$ may be selected from hydrogen, deuterium, —F, —Cl, —Br, —I, a hydroxyl group, a cyano group, a nitro group, an amino group, an amidino group, a hydrazine group, a hydrazone group, a $C_1$-$C_{20}$ alkyl group, a $C_2$-$C_{20}$ alkenyl group, a $C_2$-$C_{20}$ alkynyl group, and a $C_1$-$C_{20}$ alkoxy group; and a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a $C_1$-$C_{20}$ alkyl group, a $C_2$-$C_{20}$ alkenyl group, a $C_2$-$C_{20}$ alkynyl group, and a $C_1$-$C_{20}$ alkoxy group, and \* indicates a binding site to a neighboring atom.

For example, $R_1$ may be an alkylsiloxane group, an alkylphosphonic acid group, a catechol group, a carboxylic acid group, a thiol group, or an amine group.

$T_1$ in Formula 1 may be selected from a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group.

$T_1$ in Formula 1 may be a photoreactive group. In this regard, the term "photoreactive group" refers to a group (photoreactive group) in which a polymerization reaction occurs when irradiated with light. The photoreactive group may change the alignment thereof by polarization.

At least one substituent of the substituted $C_3$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, and the substituted $C_1$-$C_{60}$ alkoxy group may be selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), wherein $Q_1$ to $Q_2$ and $Q_{11}$ to $Q_{13}$ may each independently be selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and \* and \*' each indicate a binding site to a neighboring atom.

For example, the liquid crystal ligand 20 may be at least one selected from ligand 1 to ligand 4:

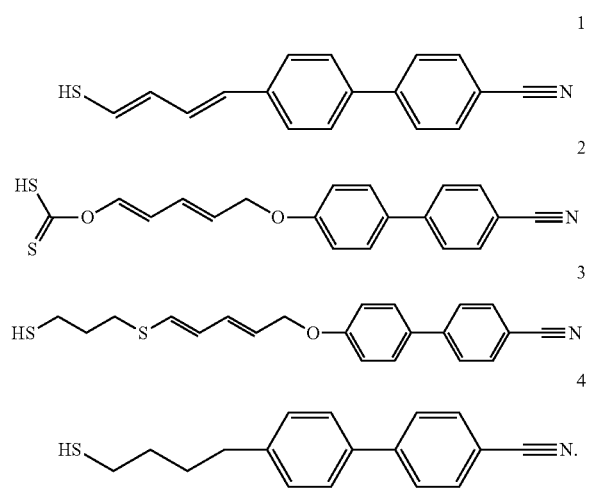

As described above, the quantum rod 1 includes the nanoparticle 10 and a liquid crystal ligand 20 linked to the surface of the nanoparticle 10.

The liquid crystal ligand 20 may adjust the orientation alignment due to the inclusion of the photoreactive group of which orientation alignment is adjustable by polarized light.

The linking of $A_1$ and $A_2$, which are core groups, with the anchoring group ($R_1$) in the liquid crystal ligand 20, and the linking between $A_1$ with $A_2$ may be made by the linker group ($L_1$, $L_2$, or $L_3$), and the linker group may have a conjugation structure.

Furthermore, because the quantum rod 1 includes the core groups ($A_1$ and $A_2$) in the liquid crystal structure of the liquid crystal ligand 20, compared to the cases in which the core groups are not present, the quantum rod may align in one direction. That is, the core groups ($A_1$ and $A_2$) in the liquid crystal structure of the liquid crystal ligand 20 may enable a plurality of the quantum rods 1 to be aligned along the same direction.

In the quantum rod 1, the liquid crystal compound is directly linked in the form of a ligand to the nanoparticle. Accordingly, compared to a case in which the liquid crystal compound is simply mixed with the nanoparticle, the one-direction alignment of the quantum rod 1 may be easily made due to the ligand. That is, the liquid crystal ligand 20 may be directly attached to the nanoparticle 10, so that the orientation may be desired (e.g., excellent).

In addition, according to the present disclosure, as will be described later, the quantum rod 1 has orientation (e.g., may be aligned along a desired orientation) while being included in the emission layer, and thus, the efficiency of the light-emitting device may be increased.

The nanoparticle 10 is a spherical (or a rod-shaped) semiconductor nanomaterial having a size of several nm to several hundreds of nm, and may include a core including a material having a small band gap and a shell located to surround the core.

In an embodiment, the nanoparticle 10 may have a core-shell structure including a core including a first semiconductor crystal and a shell including a second semiconductor crystal, or may be a perovskite compound.

For example, the first semiconductor crystal and the second semiconductor crystal may each independently include a Group 12-Group 16-based compound (e.g., a Group II-VI based compound), a Group 13-Group 15-based compound (e.g., a Group III-V based compound), a Group 14-Group 16-based compound (e.g., a Group IV-VI based compound), a Group 14-based compound (e.g., a Group IV based compound), a Group 11-Group 13-Group 16-based compound (e.g., a Group I-III-VI based compound), a Group 11-Group 12-Group 13-Group 16-based compound (e.g., a Group I-II-III-VI based compound), or any combination thereof.

For example, the first semiconductor crystal and the second semiconductor crystal may each independently include CdS, CdSe, CdTe, ZnS, ZnSe, ZnTe, ZnO, HgS, HgSe, HgTe, MgS, MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe; CdZnSeS, CdZnSeTe, CdZnSTe, CdHgSeS, CdHgSeTe, CdHgSTe, HgZnSeS, HgZnSeTe, HgZnSTe;

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP; GaAl-NAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, InZnP;

SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, SnPbSTe;

Si, Ge, SiC, SiGe;

AgInS, $AgInS_2$, CuInS, $CuInS_2$, $CuGaO_2$, $AgGaO_2$, $AgAlO_2$; or any combination thereof.

For example, the first semiconductor crystal may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAl-PAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor crystal may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

Meanwhile, the perovskite compound is a material having a three-dimensional crystal structure associated with the crystal structure of $CaTiO_3$.

For example, the perovskite compound may be represented by Formula 4:

$$[A][B_m][X]_3 \qquad \text{Formula 4}$$

wherein, in Formula 4,

A may be at least one monovalent organic-cation, a monovalent inorganic-cation, or any combination thereof, B may be at least one divalent inorganic-cation, m is a real number satisfying the condition of $0 < m \leq 1$, and X may be at least one monovalent anion.

The average diameter (D50) of the nanoparticle 10 may be from about 5 nm to about 100 nm, and the aspect ratio thereof may be from about 1.1:1 to about 20:1.

The nanoparticle 10 may be a one-dimensional particle having a length (e.g., while sizes in other dimensions are negligible) or a two-dimensional particle in the form of a plate.

The D50 of the quantum rod 1 may be from about 5 nm to about 1000 nm, for example, from about 50 nm to about 1000 nm, or from about 100 nm to about 500 nm. In an embodiment, the D50 of the quantum rod 1 may be from about 100 nm to about 200 nm. When the D50 of the quantum rod 1 satisfies the above-described ranges, the quantum rod 1 may have a desired (e.g., excellent) dispersion degree while a relatively large amount of nanoparticle 10 may be dispersed.

For example, the aspect ratio (e.g., ratio between the length and the diameter) of the quantum rod 1 may be from about 1.1:1 to about 20:1.

The quantum rod 1 may be a one-dimensional particle having a length or a two-dimensional particle in the form of a plate.

[Light-Emitting Device]

Figure 2:
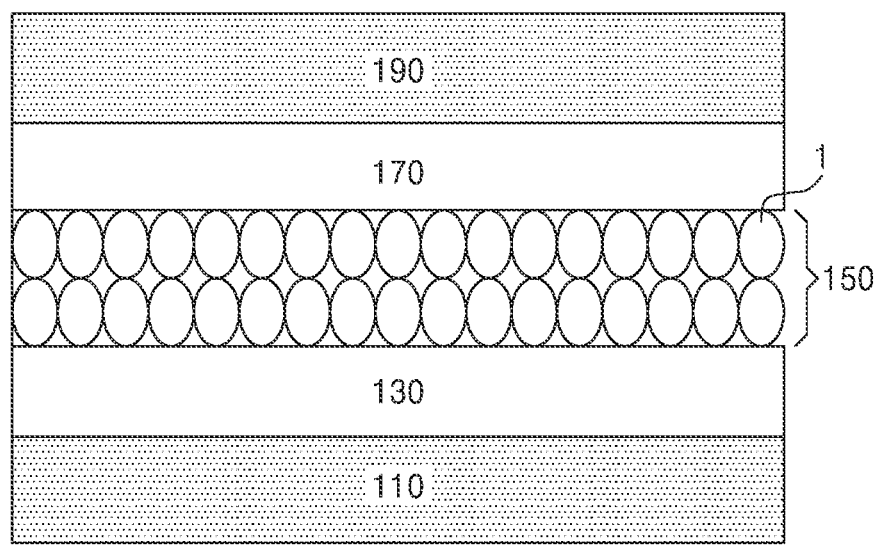
FIG. 2 is a schematic view of a light-emitting device according to another embodiment.

FIG. 2 is a schematic cross-sectional view of a light-emitting device 100 according to an embodiment.

Hereinafter, the structure of the light-emitting device 100 according to an embodiment and a method of manufacturing the light-emitting device 100 will be described in connection with FIG. 2.

Referring to FIG. 2, the light-emitting device 100 according to an embodiment includes a first electrode 110, a second electrode 190 facing the first electrode 110, and an emission layer 150 located between the first electrode 110 and the second electrode 190, wherein the emission layer 150 includes the quantum rod 1.

The quantum rod 1 may be the same as described above.

For example, the light-emitting device 100 may further include at least one of a hole transport region 130 located between the first electrode 110 and the emission layer 150, or an electron transport region 170 located between the emission layer 150 and the second electrode 190.

[First Electrode 110]

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

In FIG. 2, a substrate may be additionally located under the first electrode 110 or above the second electrode 190. The substrate may be a glass substrate or a plastic substrate, each having desired (e.g., excellent) mechanical strength, thermal stability, transparency, surface smoothness, ease of handling, and/or water resistance.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

[Hole Transport Region 130]

The hole transport region 130 may have i) a single-layered structure including (e.g., consisting of) a single material, ii) a single-layered structure including a plurality of different materials, or iii) a multi-layered structure having a plurality of layers including a plurality of different materials.

The hole transport region 130 may include at least one layer selected from a hole injection layer, a hole transport layer, an emission auxiliary layer, and an electron blocking layer.

For example, the hole transport region 130 may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in the respective stated order, but the structure of the hole transport region is not limited thereto.

The hole transport region may include at least one selected from m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

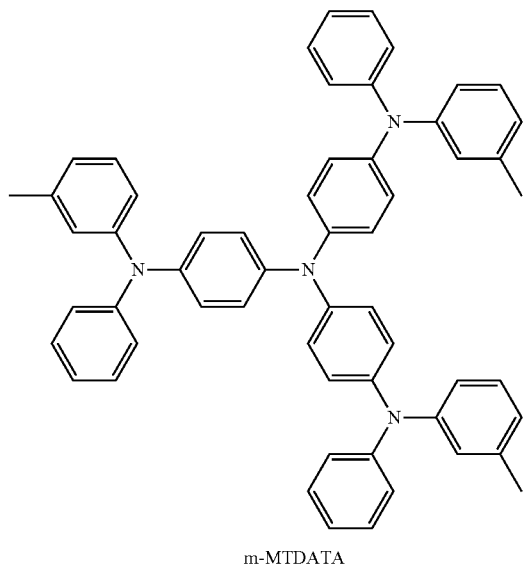

m-MTDATA

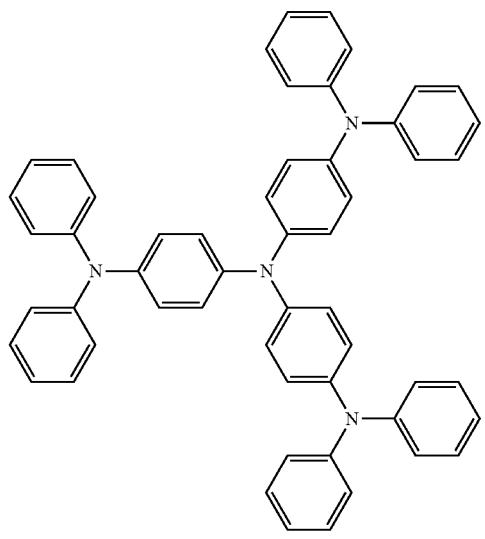

TDATA

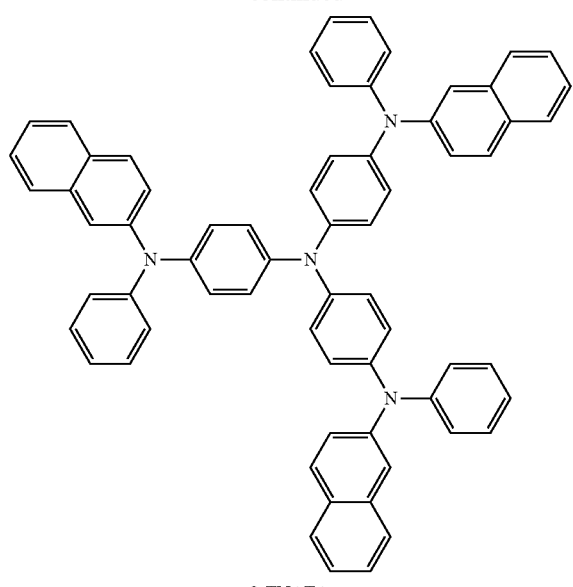
2-TNATA
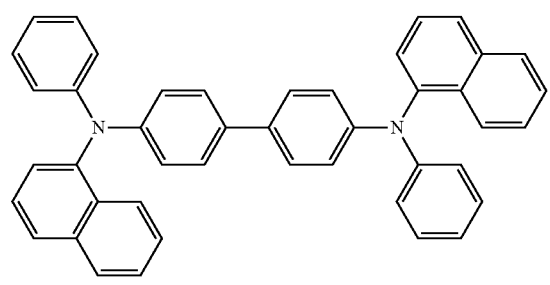
NPB
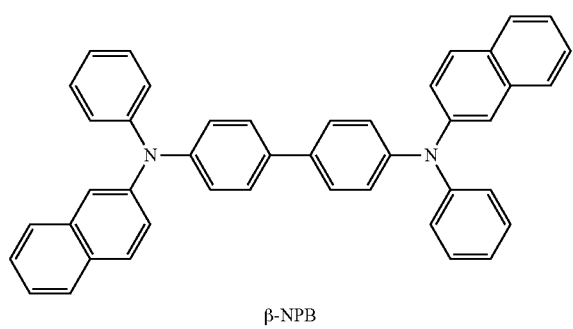
β-NPB
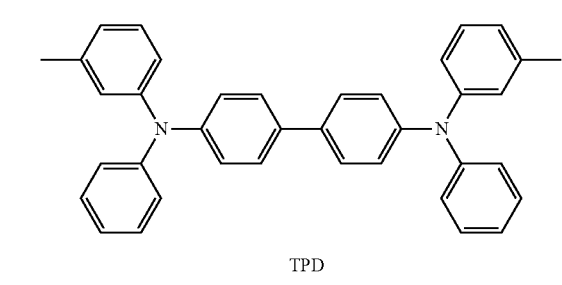
TPD
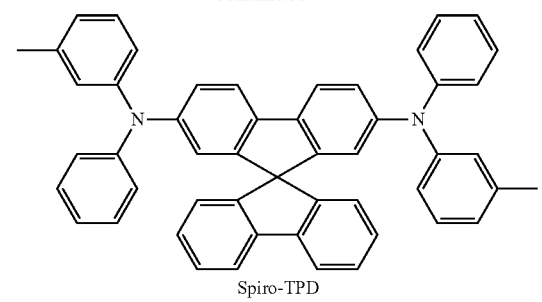
Spiro-TPD
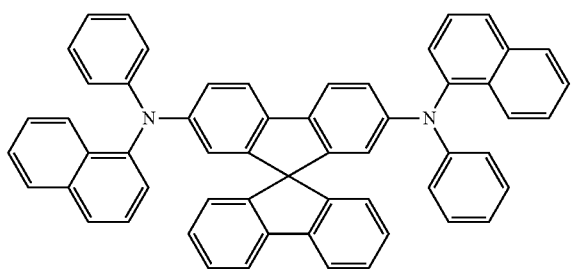
Spiro-NPB
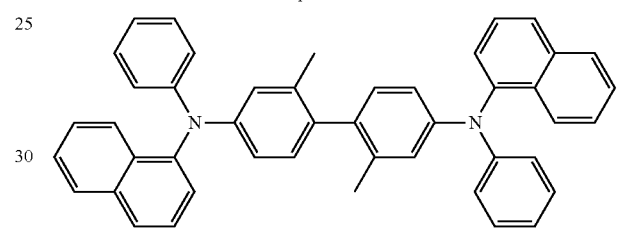
methylated NPB
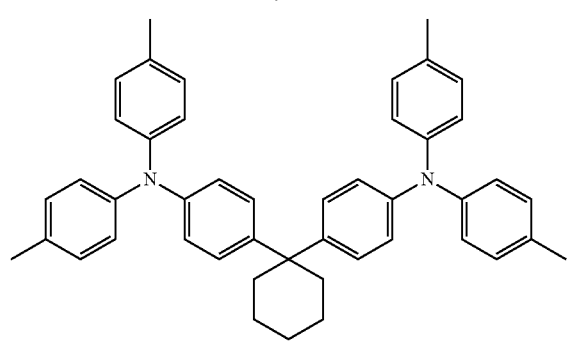
TAPC
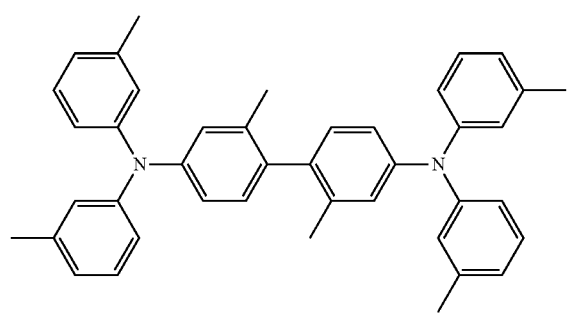
HMTPD
Formula 201
$$R_{201}\!-\!(L_{201})_{xa1}\!-\!N\!\begin{matrix}(L_{202})_{xa2}\!-\!R_{202}\\(L_{203})_{xa3}\!-\!R_{203}\end{matrix}$$

Formula 202

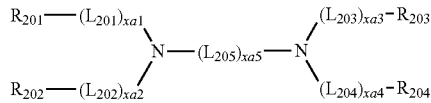

wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $R_{201}$ and $R_{202}$ in Formula 202 may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In an embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), wherein $Q_{31}$ to $Q_{33}$ are the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may be selected from;

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, the compound represented by Formula 201 may be represented by Formula 201A below:

Formula 201A

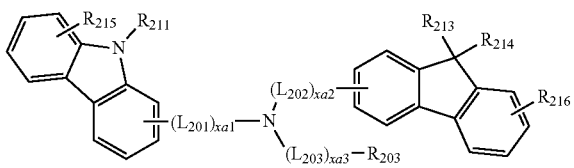

In one or more embodiments, the compound represented by Formula 201 may be represented by Formula 201A(1) below, but embodiments of the present disclosure are not limited thereto:

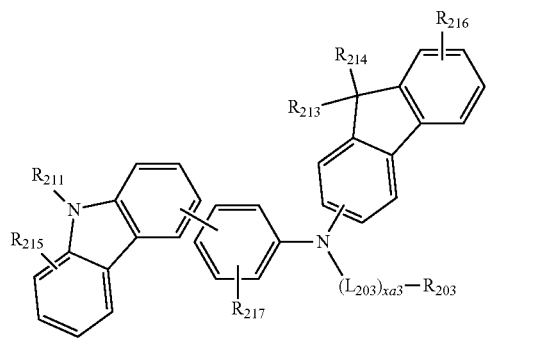

Formula 201A(1)

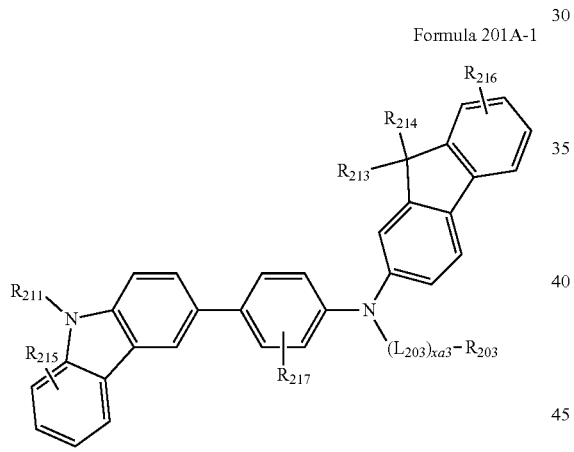

Formula 201A-1

In one or more embodiments, the compound represented by Formula 201 may be represented by Formula 201A-1 below, but embodiments of the present disclosure are not limited thereto:

In one or more embodiments, the compound represented by Formula 202 may be represented by Formula 202A below:

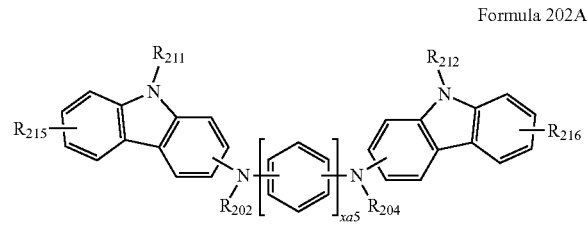

Formula 202A

In one or more embodiments, the compound represented by Formula 202 may be represented by Formula 202A-1 below:

Formula 202A-1

In Formulae 201A, 201A(1), 201A-1, 202A, and 202A-1, $L_{201}$ to $L_{203}$, xa1 to xa3, xa5, and $R_{202}$ to $R_{204}$ are the same as respectively described above, $R_{211}$ and $R_{212}$ are each independently the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region 130 may include at least one compound selected from Compounds HT1 to HT39, but embodiments of the present disclosure are not limited thereto:

25
HT1
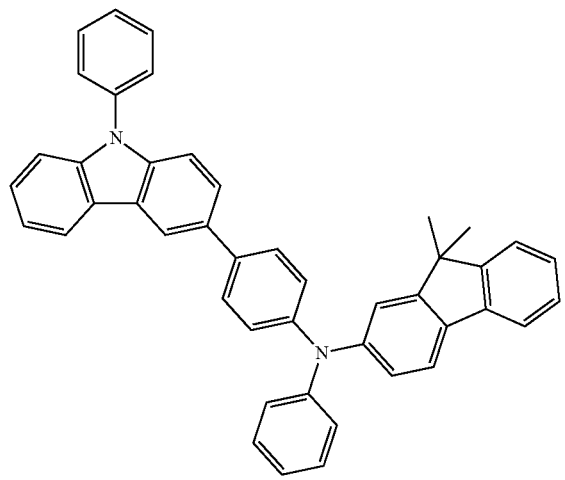
26
HT2
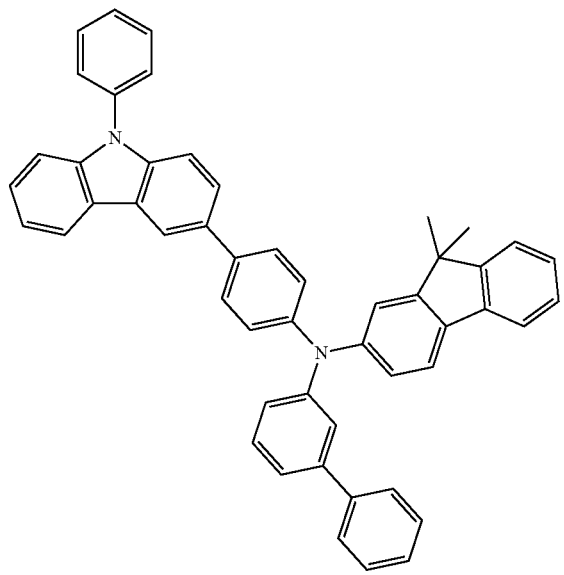
HT3
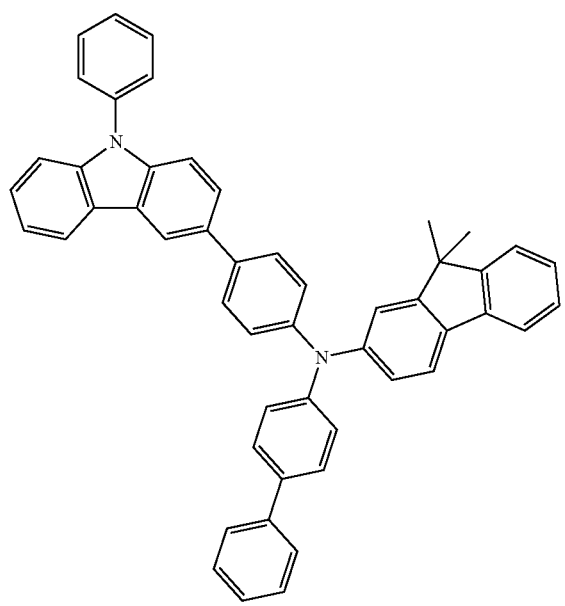
HT4
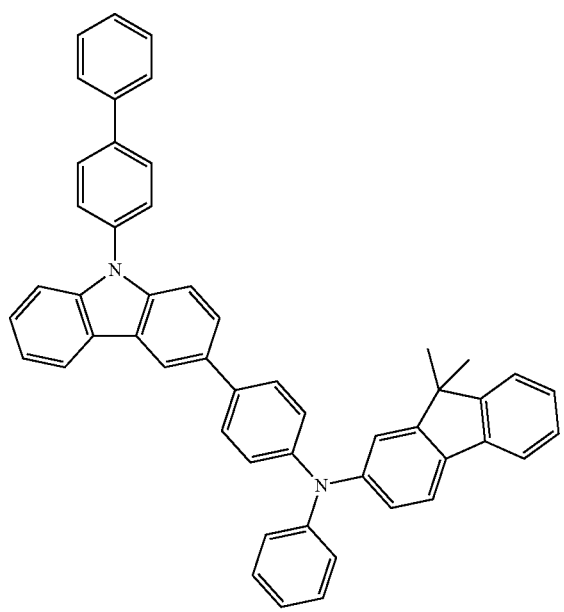

-continued
HT5
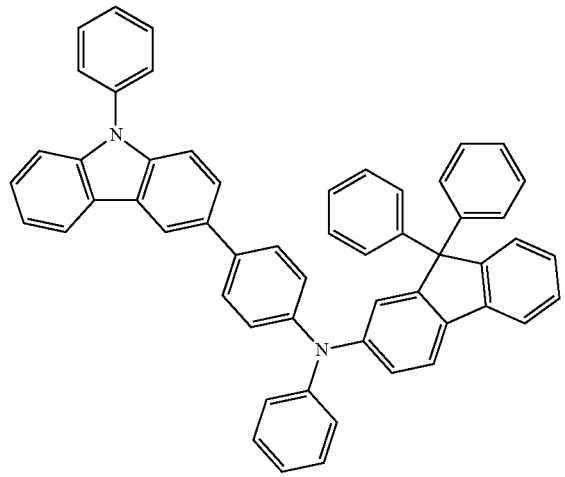
HT6
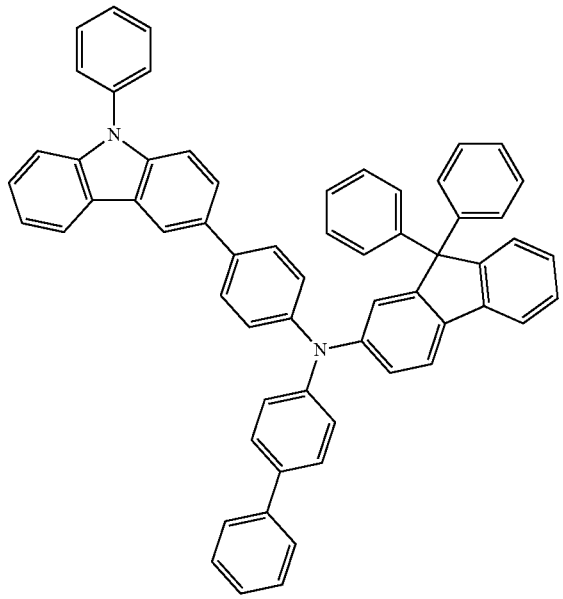
HT7
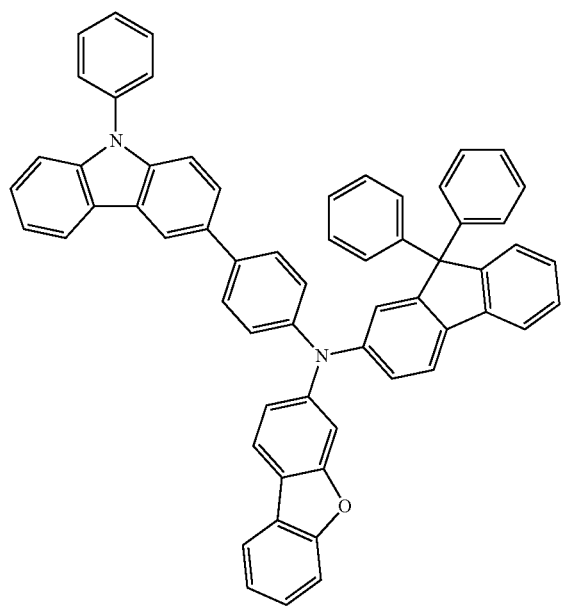
HT8
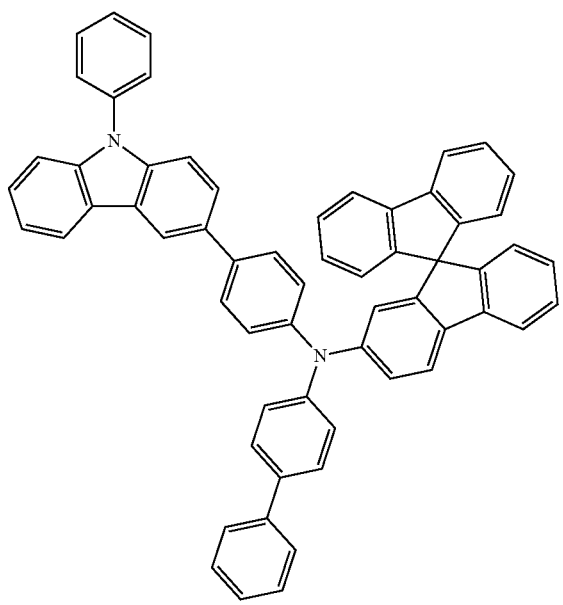

-continued
HT9
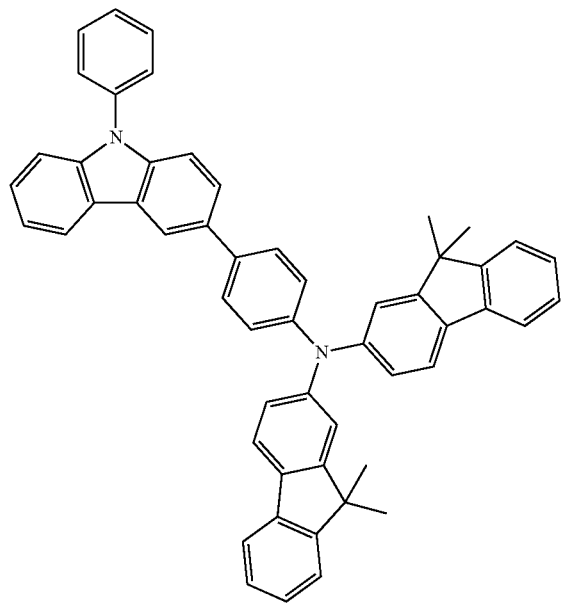
HT10
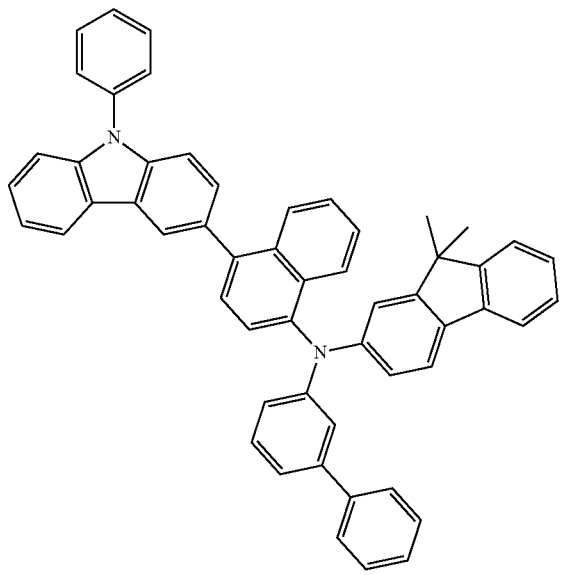
HT11
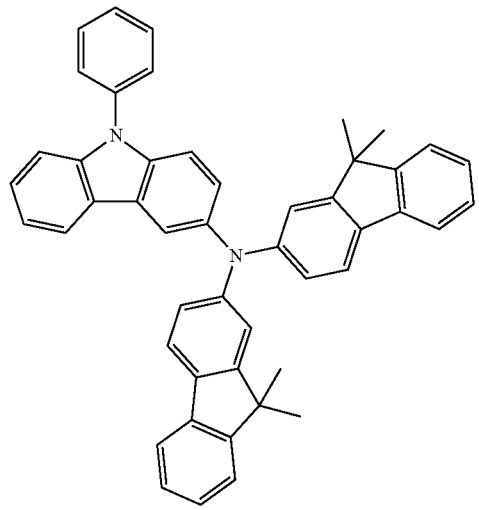
HT12
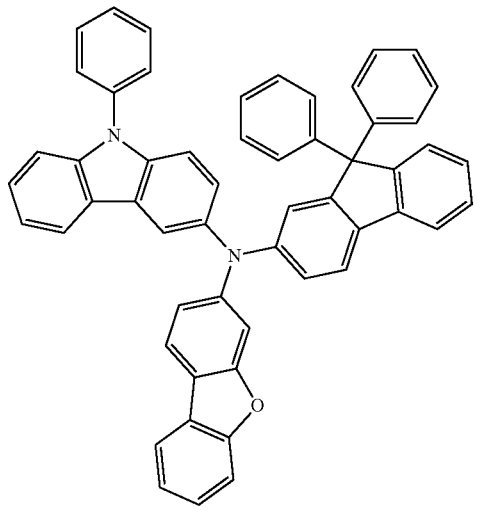

-continued
HT13
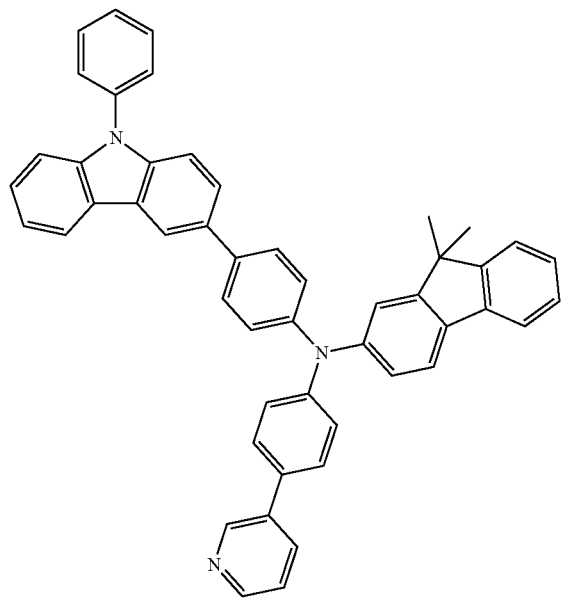
HT14
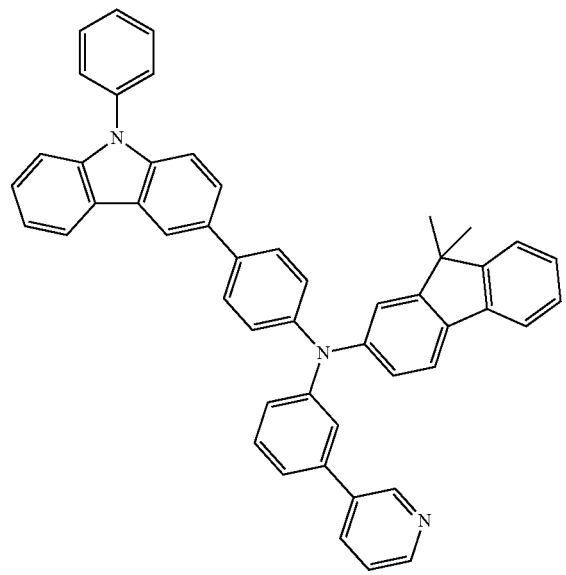
HT15
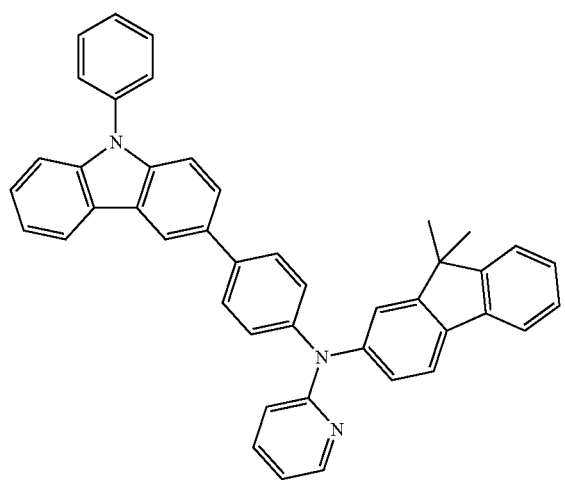
HT16
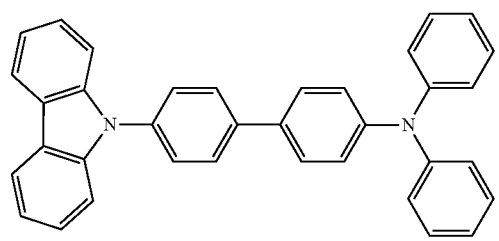
HT17
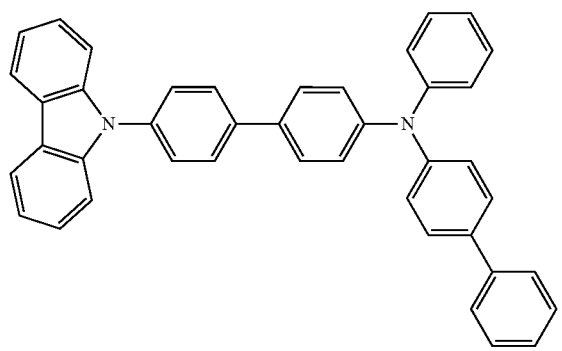
HT18
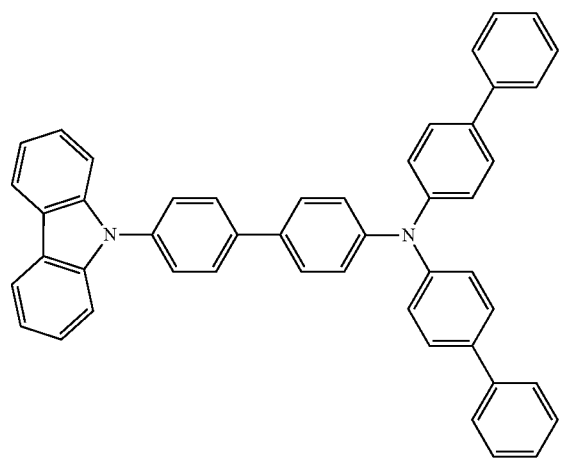

-continued
HT19
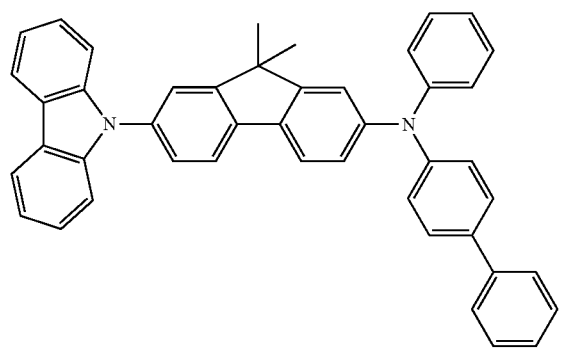
HT20
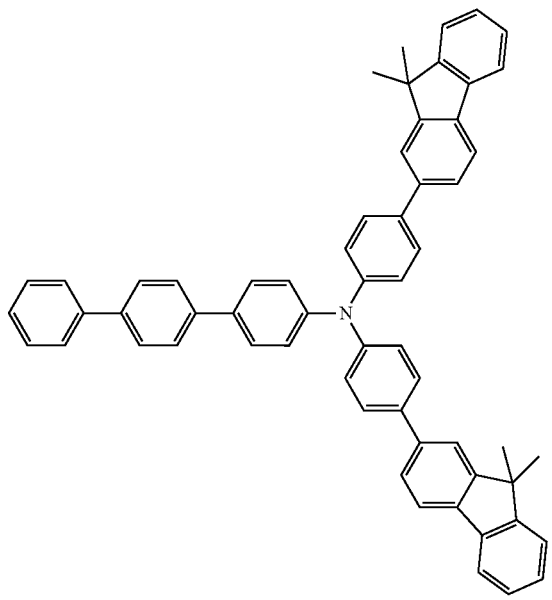
HT21
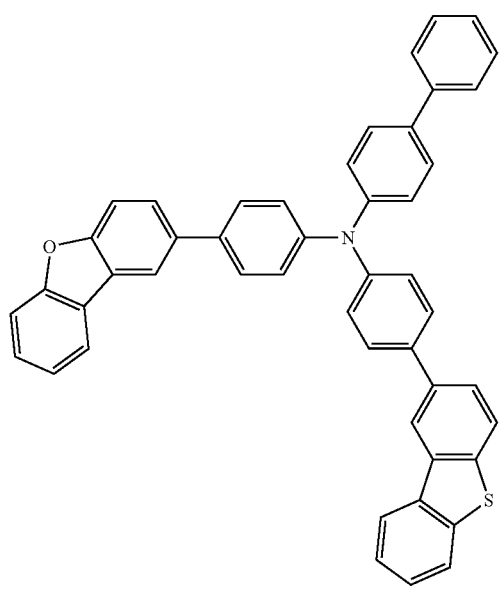
HT22
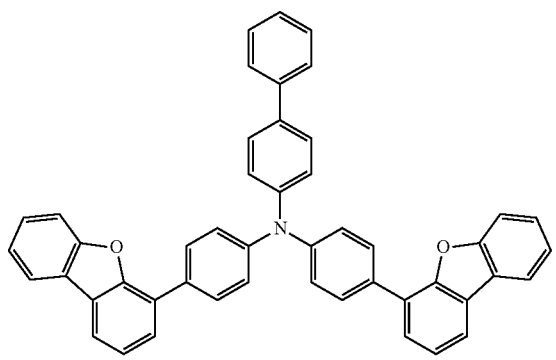

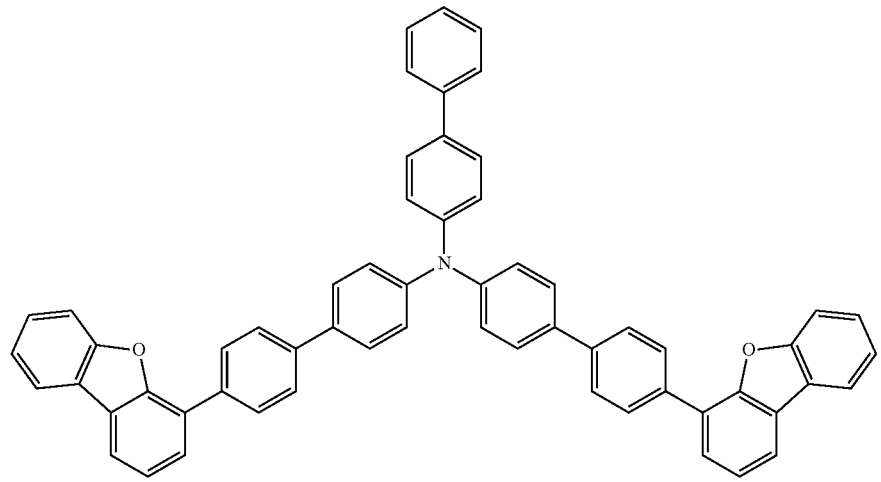
HT23
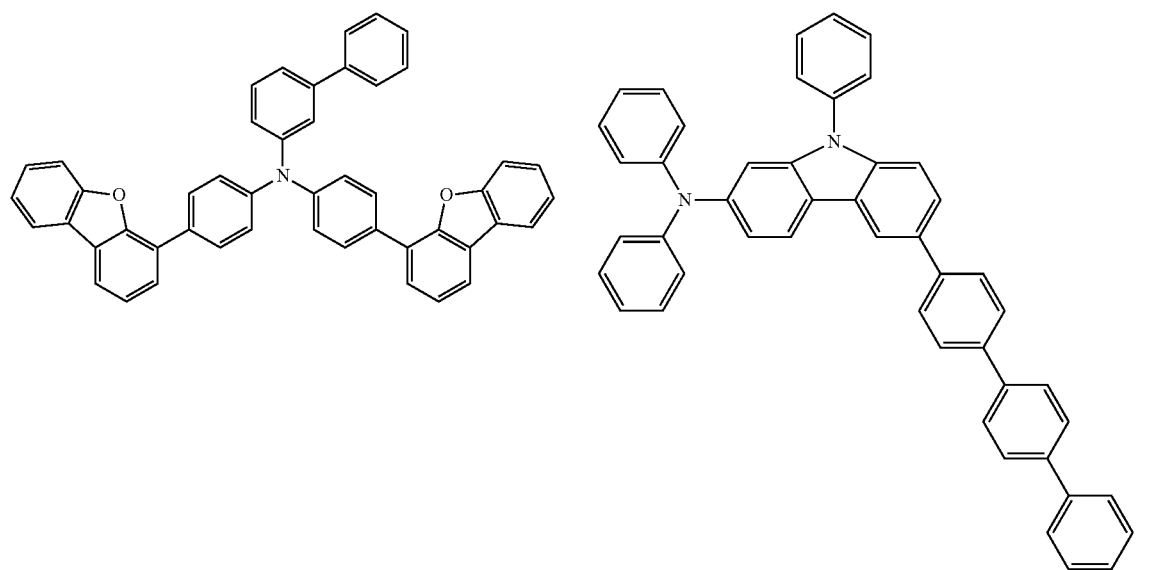
HT24  HT25
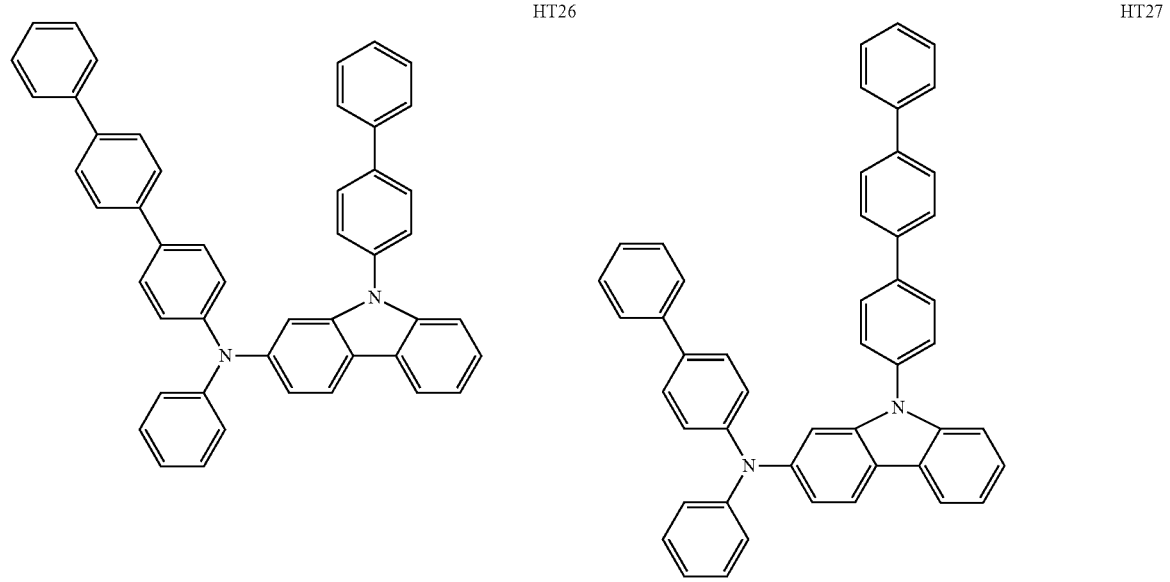
HT26  HT27

-continued
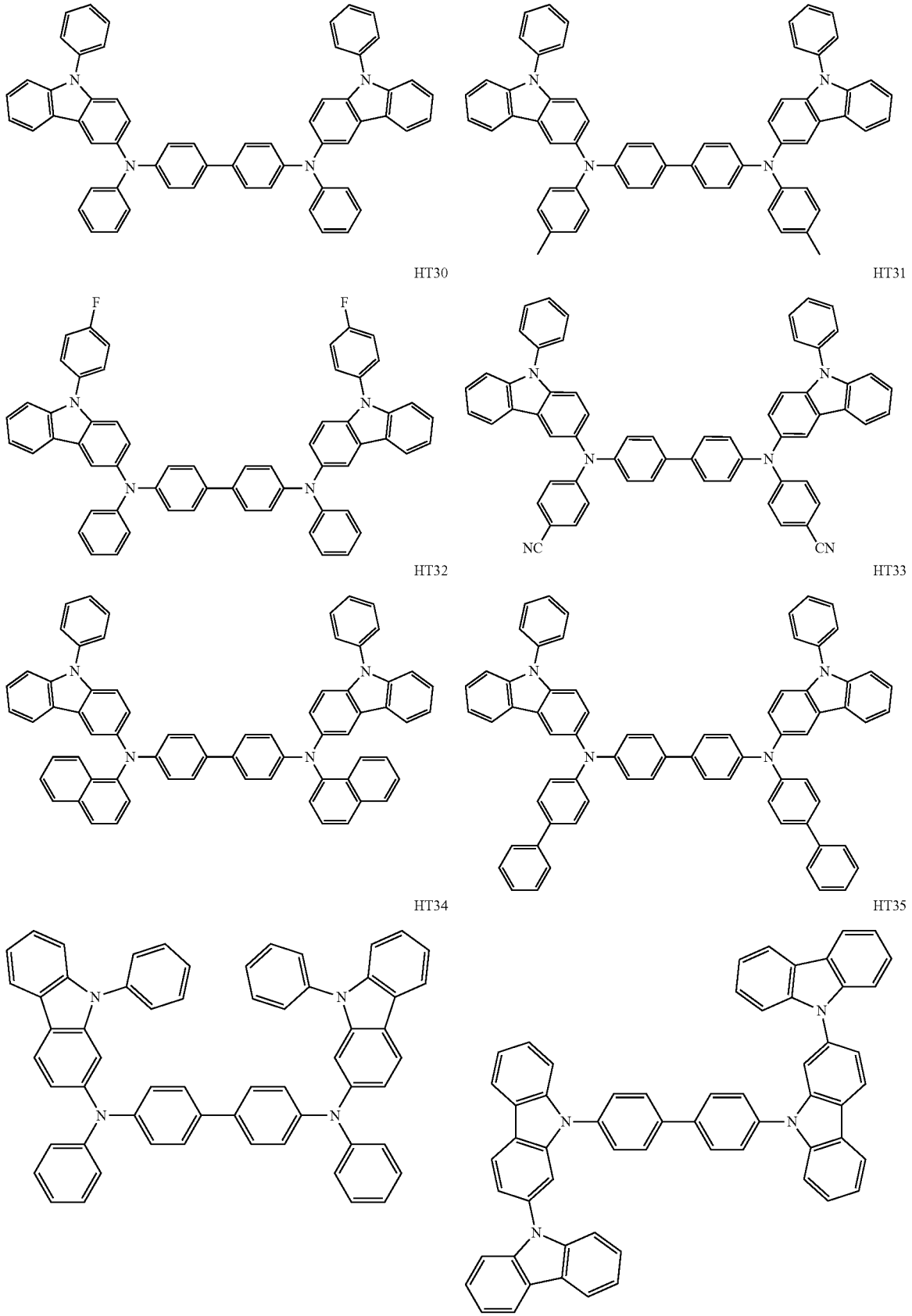

-continued

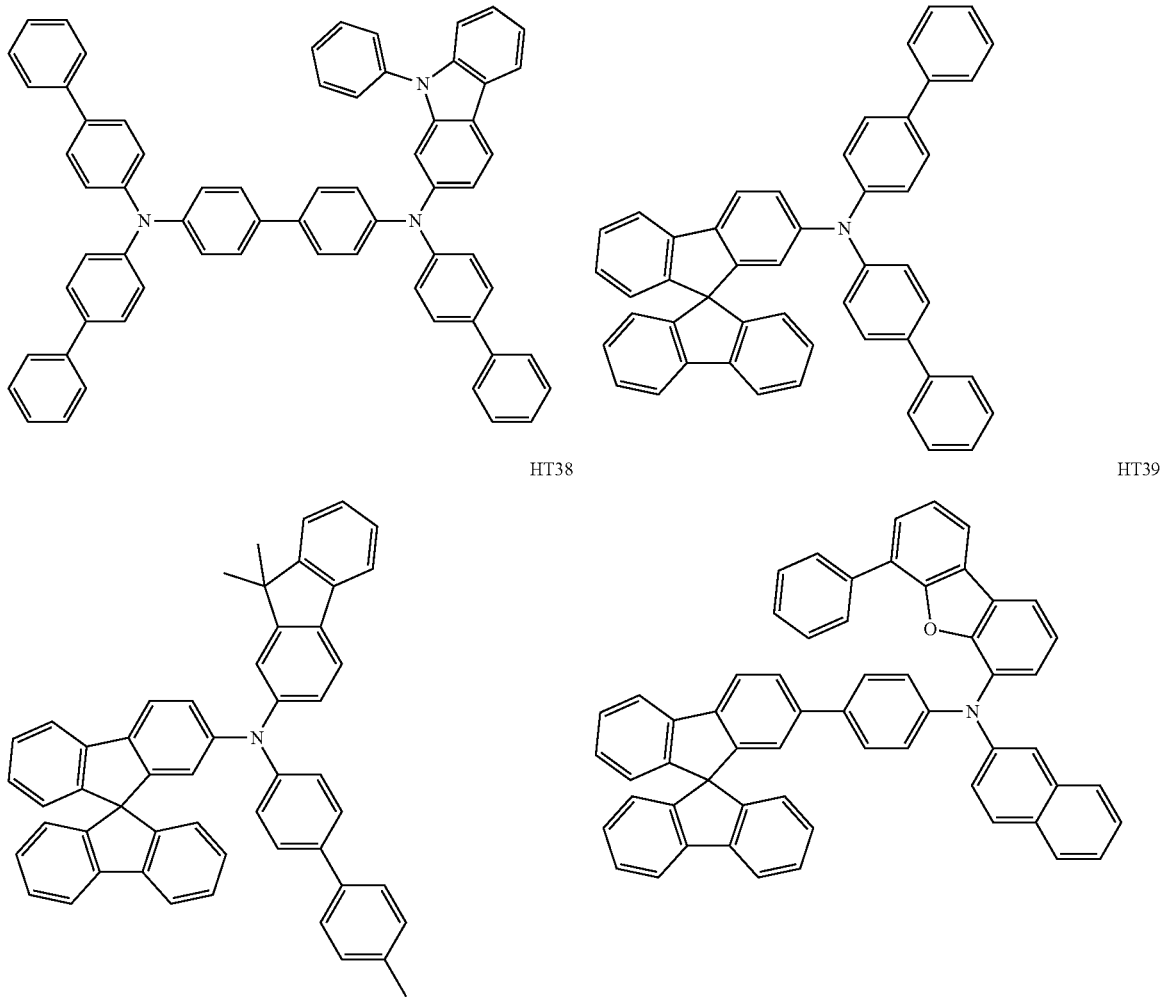

In one embodiment, the hole transport region 130 may include a metal oxide.

A thickness of the hole transport region 130 may be in a range of about 100 Å to about 10,000 Å, for example, about 100 Å to about 1,000 Å. When the thickness of the hole transport region 130 is within the ranges described above, satisfactory hole transportation characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[Emission Layer 150]

The emission layer 150 may be a single layer or may have a structure in which two or more layers are stacked. In an embodiment, the emission layer 150 may have a single-layered structure or a structure in which two to ten layers are stacked.

The emission layer 150 includes at least one quantum rod 1 described above. For example, the emission layer 150 may include a plurality of quantum rods 1 described above.

Quantum rods may be dispersed in a naturally coordinated form in a dispersion medium such as an organic solvent or polymer resin, and the dispersion medium may be any transparent medium that does not affect the wavelength conversion performance of the quantum rods, does not change by light or reflect light, and does not cause absorption of light. For example, the organic solvent may include at least one of toluene, chloroform, or ethanol, and the polymer resin may include epoxy, silicone, polyethylene, and/or acrylate.

Unlike a bulky material (e.g., a material with a larger size), a quantum rod has a discontinuous band gap energy due to the quantum confinement effect. In addition, regarding the quantum rod, a gap between energy bands varies according to the size of the quantum rod, and even when the quantum rod including the same material is utilized, light with different wavelengths may be emitted when the size thereof is different. The smaller the size of the quantum rod, the greater the band gap energy. Accordingly, light having a shorter wavelength may be emitted. Utilizing these characteristics, the size of the quantum rod is adjusted by appropriately changing the growth condition of the nanocrystal to obtain light of the desired wavelength range. Therefore, by introducing such a quantum rod into a light-emitting device, a light-emitting device having high light efficiency (e.g., light-emitting efficiency) and color purity may be implemented.

Figure 3:
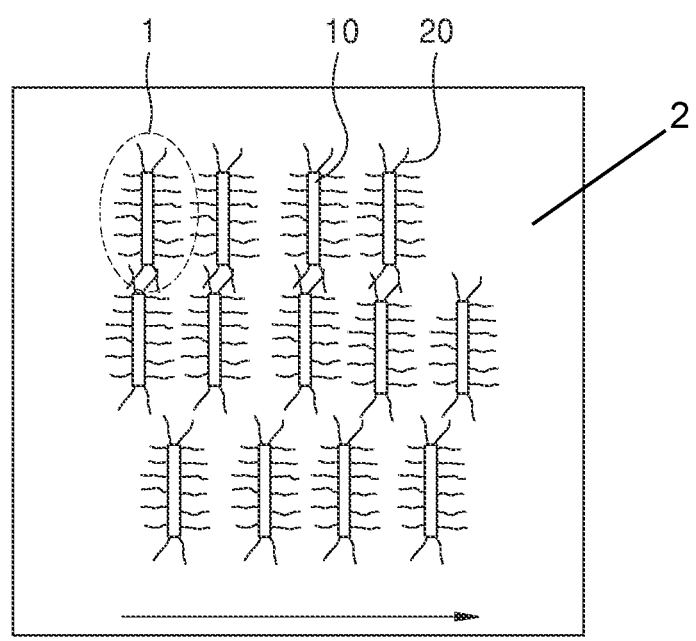
FIG. 3 is a cross-sectional view schematically illustrating an emission layer including quantum rods aligned by a liquid crystal ligand in a light-emitting device according to an embodiment.

FIG. 3 is a cross-sectional view schematically illustrating the emission layer 150 including the quantum rod 1 aligned by the liquid crystal ligand 20 in a light-emitting device according to an embodiment.

Referring to FIG. 3, the emission layer 150 may further include a substrate 2, and a plurality of quantum rods 1 may be arranged in the same orientation on the substrate 2.

In other words, due to the nature of the liquid crystal ligands 10 included in the quantum rods 1 to be aligned, the quantum rods 1 may be uniformly aligned. That is, the quantum rods 1 may be uniformly aligned as a result of the alignment of the liquid crystal ligands 10.

In an embodiment, the substrate 2 may have a structure having a groove or may include an alignment layer. That is, a groove may be formed on the substrate 2, and the quantum rods 1 may be aligned by the groove. Or, a separate alignment layer may be formed on the substrate 2 to align the quantum rods 1.

As such, the quantum rods 1 may be aligned with the substrate 2 by interaction.

In this regard, for usage as the "alignment layer", any alignment layer that is utilized in liquid crystal display apparatuses of the related art may be utilized without particular limitation.

[Electron Transport Region 170]

The electron transport region 170 may have i) a single-layered structure including (e.g., consisting of) a single material, ii) a single-layered structure including a plurality of different materials, or iii) a multi-layered structure having a plurality of layers including a plurality of different materials.

The electron transport region 170 may include at least one layer selected from a buffer layer, a hole blocking layer, an electron control layer, an electron transport layer (ETL), and an electron injection layer, but embodiments of the present disclosure are not limited thereto.

For example, the electron transport region 170 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from the emission layer in the respective stated order. However, embodiments of the structure of the electron transport region are not limited thereto.

The electron transport region 170 (for example, a buffer layer, a hole blocking layer, an electron control layer, and/or an electron transport layer in the electron transport region 170) may include a metal-free compound containing at least one π electron-depleted nitrogen-containing ring.

The term "π electron-depleted nitrogen-containing ring" refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Non-limiting examples of the π electron-deficient nitrogen-containing ring are an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but embodiments of the present disclosure are not limited thereto.

For example, the electron transport region 170 may include a compound represented by Formula 601 below:

$$[Ar_{601}]_{xe11}-[(L_{601})_{xe1}-R_{601}]_{xe21} \quad \text{Formula 601}$$

wherein, in Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-deficient nitrogen-containing ring.

In an embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

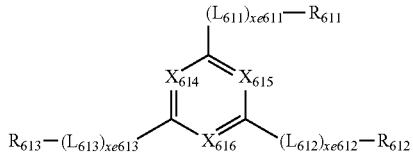

Formula 601-1 wherein, in Formula 601-1,
$X_{614}$ may be N or C($R_{614}$), $X_{615}$ may be N or C($R_{615}$), $X_{616}$ may be N or C($R_{616}$), and at least one of $X_{614}$ to $X_{616}$ may be N,
$L_{611}$ to $L_{613}$ may each independently be the same as described in connection with $L_{601}$,
xe611 to xe613 may each independently be the same as described in connection with xe1,
$R_{611}$ to $R_{613}$ may each independently be the same as described in connection with $R_{601}$, and
$R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and
—S(=O)$_2$(Q$_{601}$) and —P(=O)(Q$_{601}$)(Q$_{602}$),
wherein Q$_{601}$ and Q$_{602}$ are the same as described above.
The electron transport region 170 may include at least one compound selected from Compounds ET1 to ET36, but embodiments of the present disclosure are not limited thereto:
ET1
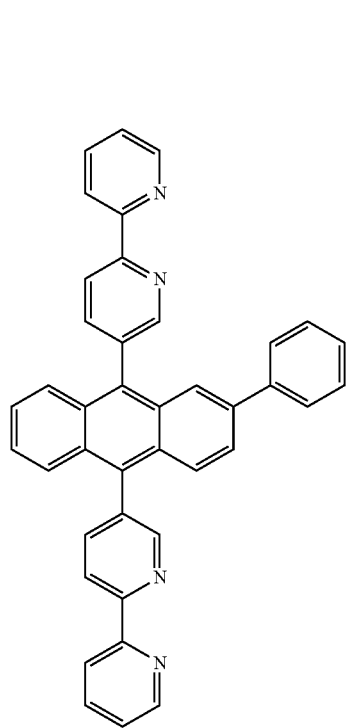
ET2
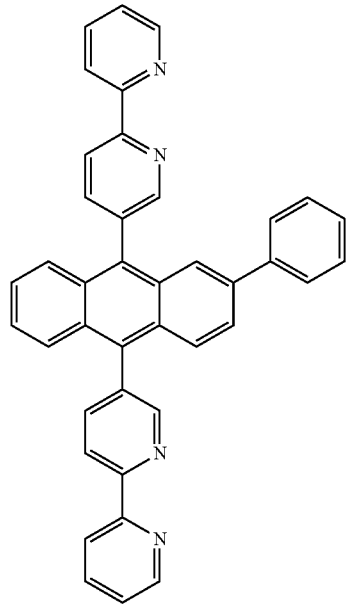
ET3
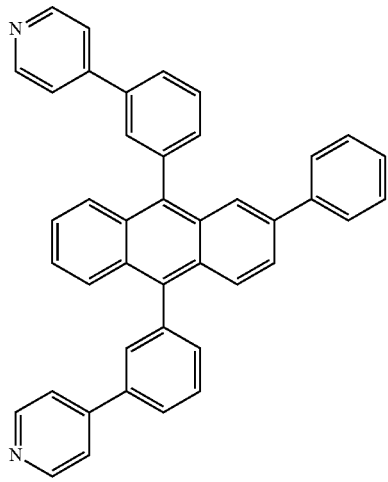
ET4
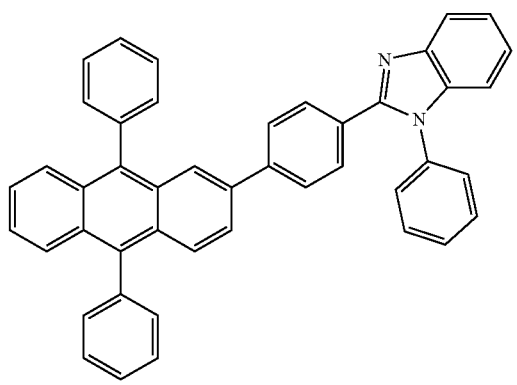
ET5
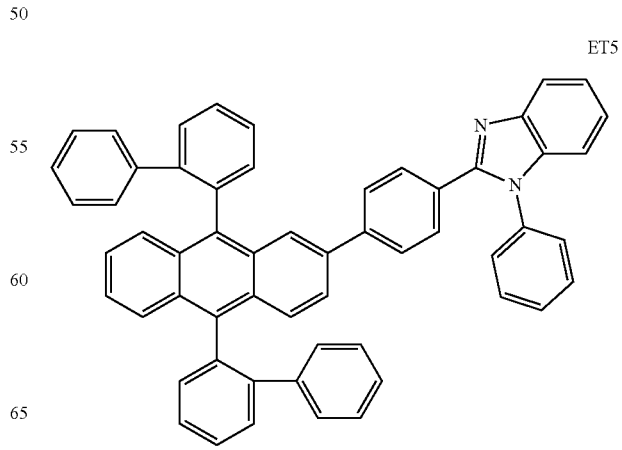

ET6
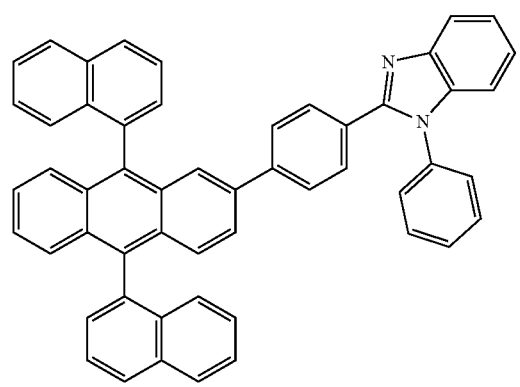
ET7
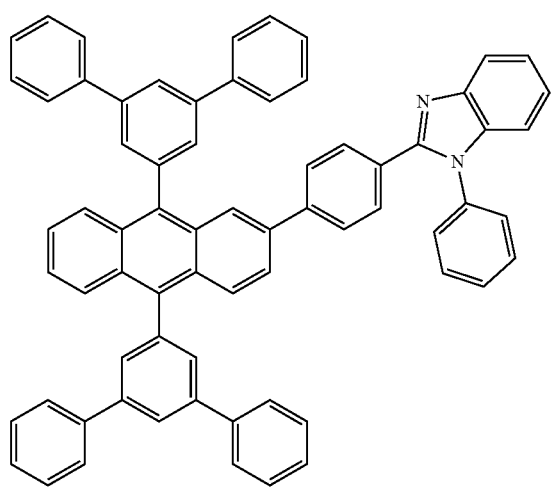
ET8
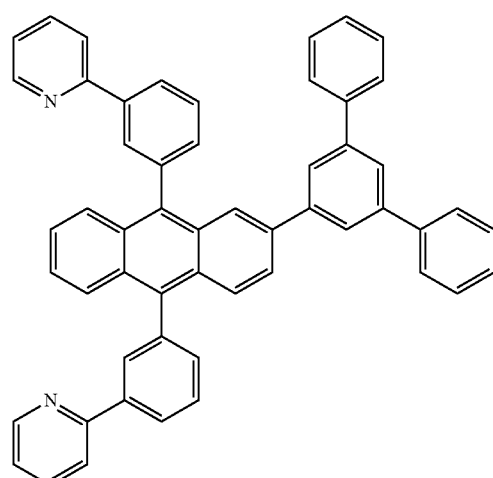
ET9
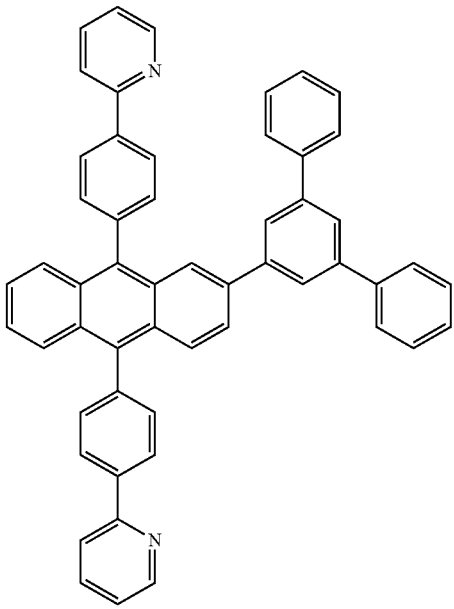
ET10
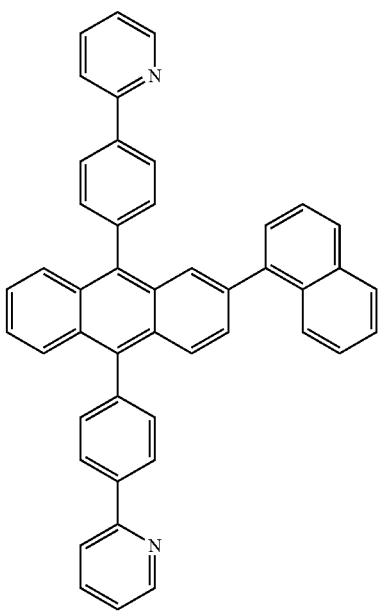

ET11
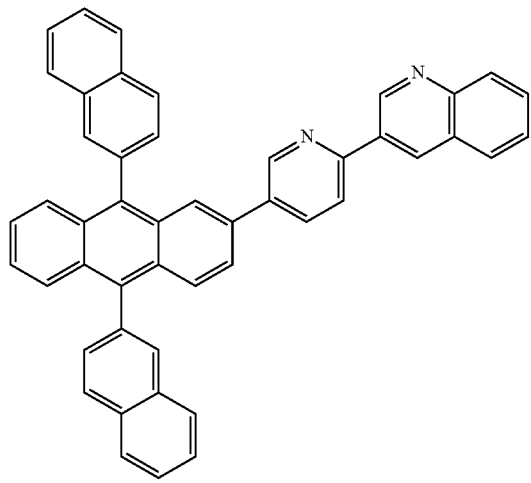
ET14
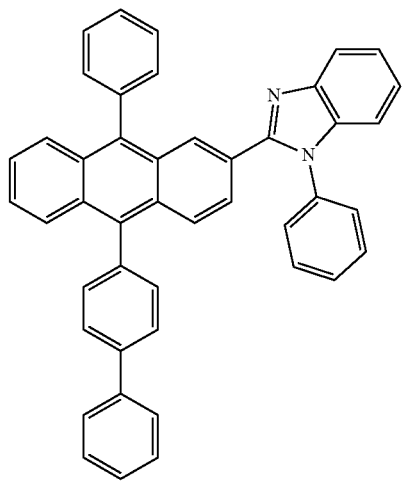
ET12
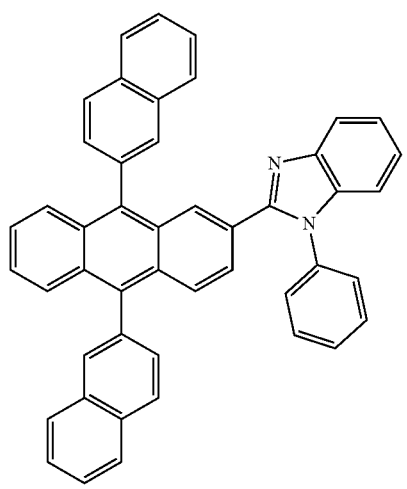
ET15
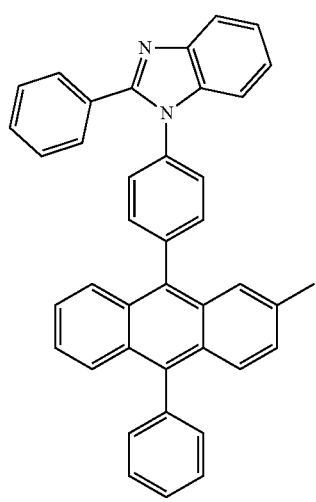
ET13
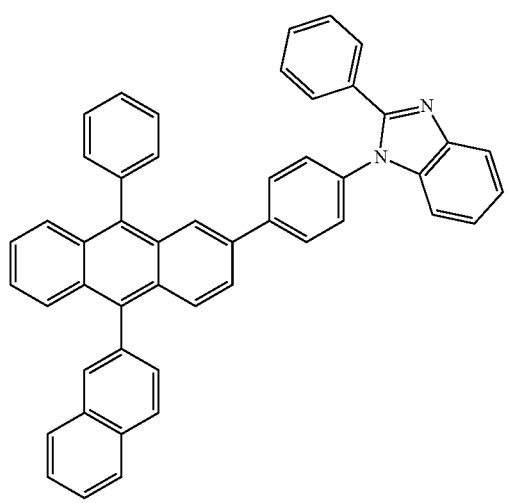
ET16
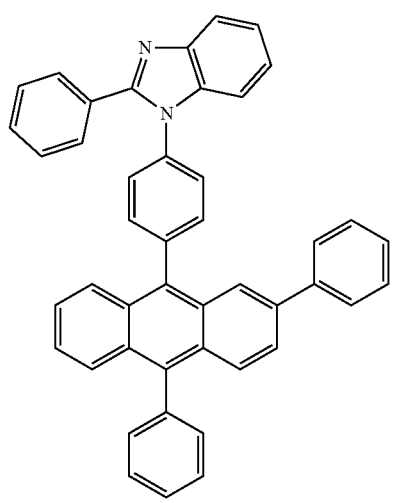

ET17
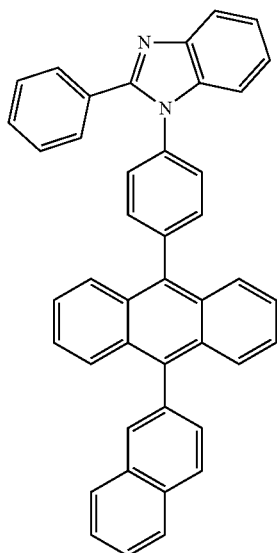
ET18
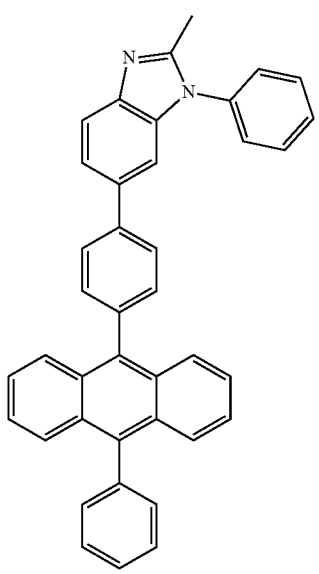
ET19
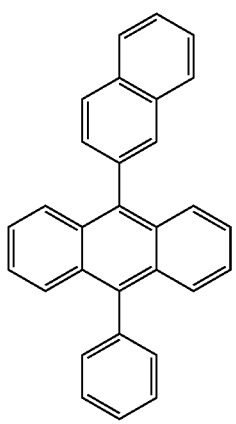
ET20
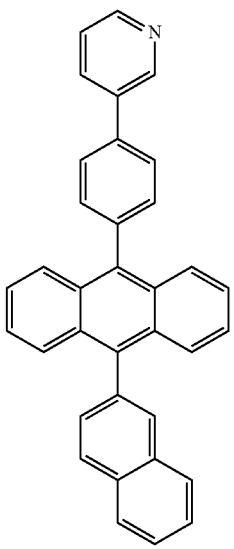
ET21
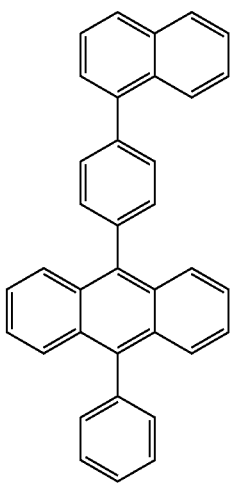
ET22
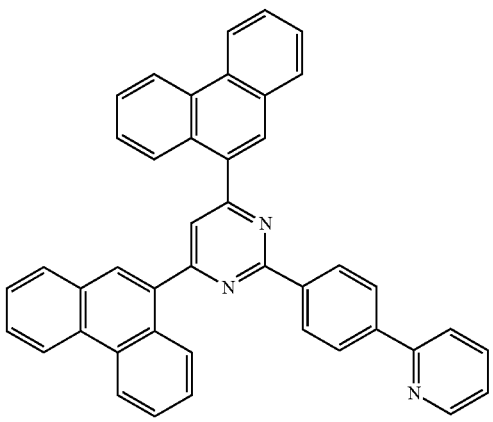

ET23
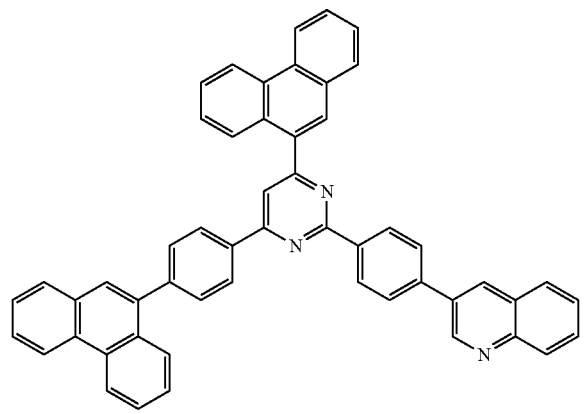
ET26
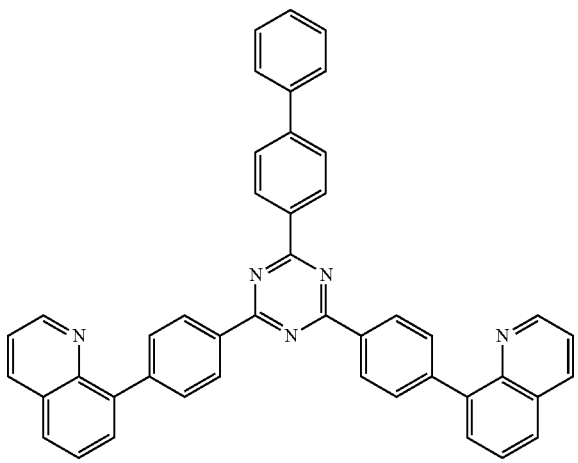
ET24
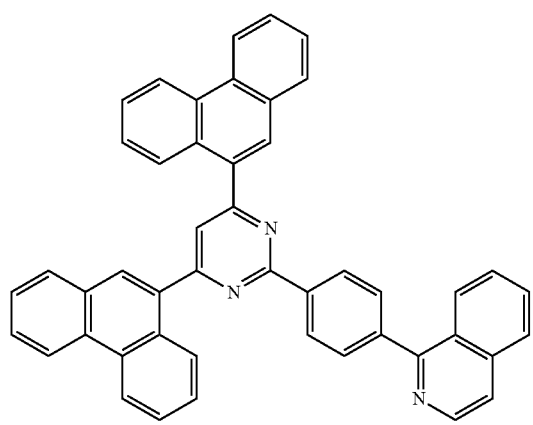
ET27
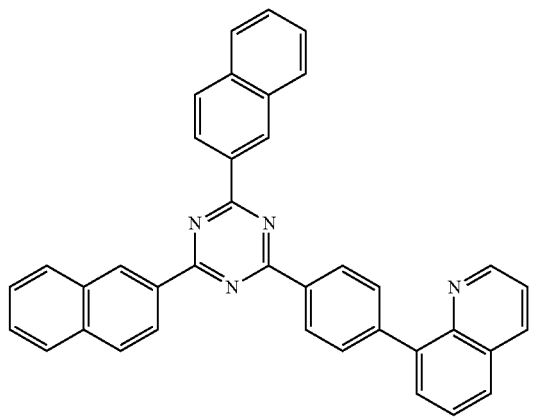
ET25
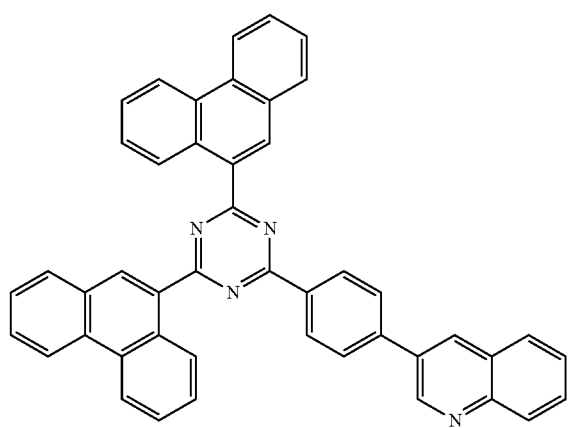
ET28
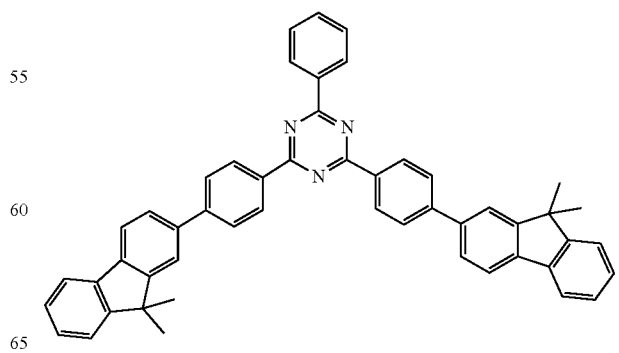

ET29
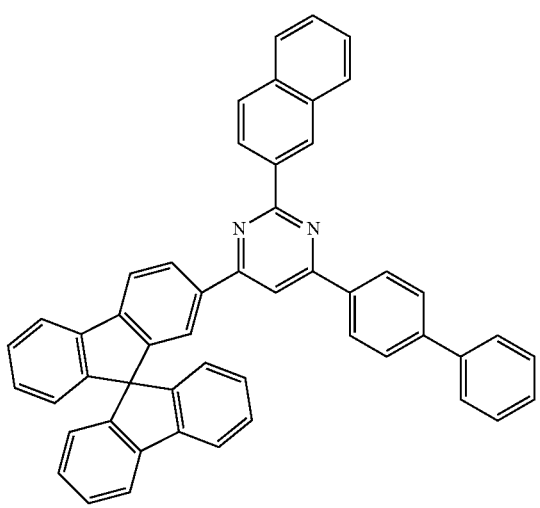
ET32
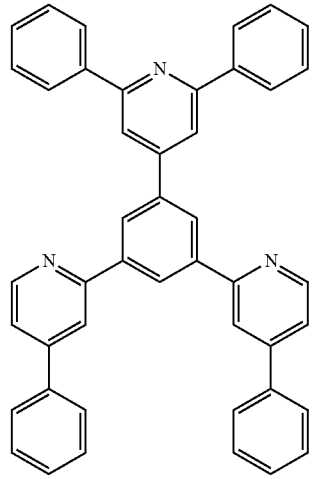
ET30
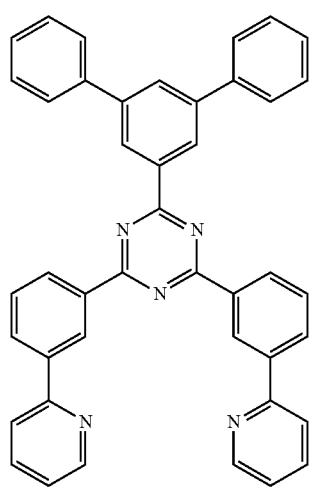
ET33
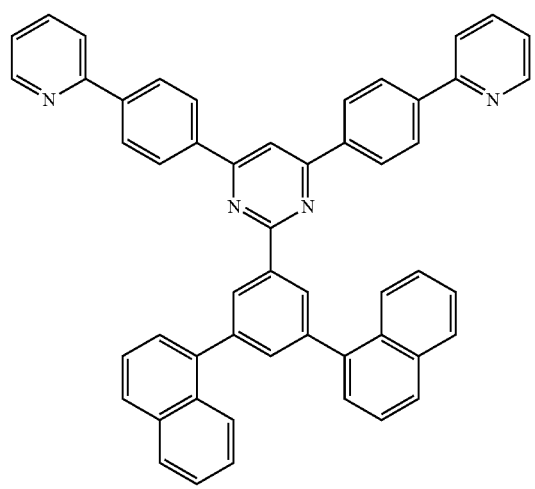
ET31
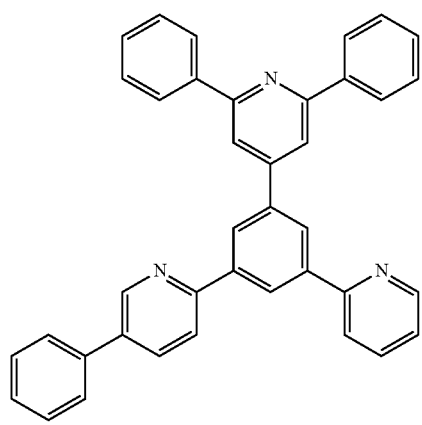
ET34
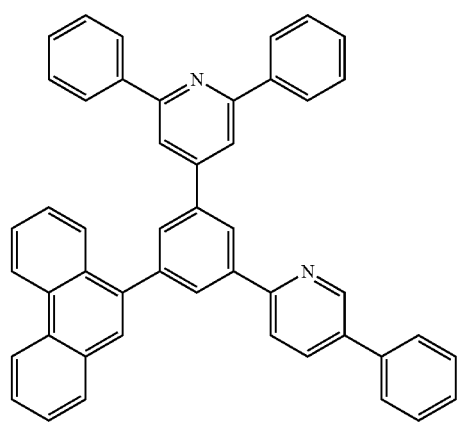

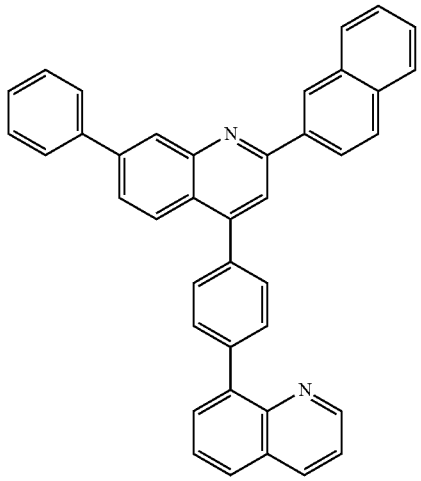

ET35

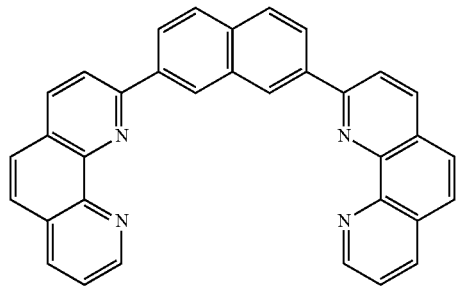

ET36

In an embodiment, the electron transport region 170 may include at least one selected from 2,9-dimethyl-4,7-diphenyl-1,10-phenanthroline (BCP), 4,7-dphenyl-1,10-phenanthroline (Bphen), Alq₃, BAlq, 3-(biphenyl-4-yl)-5-(4-tert-butylphenyl)-4-phenyl-4H-1,2,4-triazole (TAZ), and NTAZ.

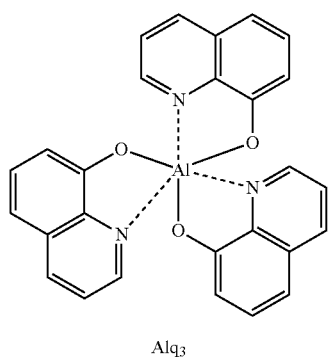

Alq₃

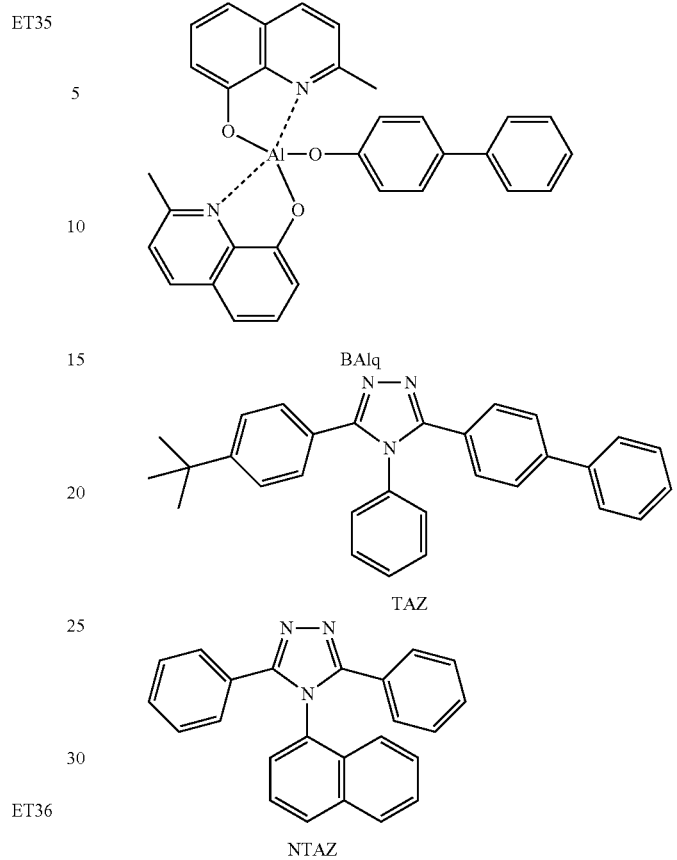

BAlq

TAZ

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, desired (e.g., excellent) hole blocking characteristics or desired (e.g., excellent) electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the ranges described above, the electron transport layer may have satisfactory electron transport characteristics without a substantial increase in driving voltage.

The electron transport region 170 (for example, the electron transport layer in the electron transport region) may further include, in addition to the materials described above, a metal-containing material.

The metal-containing material may include at least one selected from an alkali metal complex and an alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

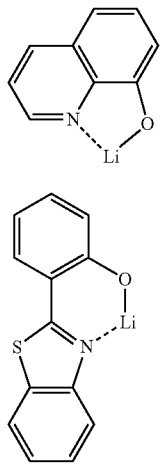

ET-D1

ET-D2

The electron transport region 170 may include an electron injection layer that facilitates the injection of electrons from the second electrode 190. The electron injection layer may directly contact the second electrode 190.

The electron injection layer may have i) a single-layered structure including (e.g., consisting of) a single material, ii) a single-layered structure including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In an embodiment, the alkali metal may be Li, Na, and/or Cs. In one or more embodiments, the alkali metal may be Li and/or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, and/or iodides) of the alkali metal, the alkaline earth-metal, and the rare earth metal.

The alkali metal compound may be selected from alkali metal oxides, such as $Li_2O$, $Cs_2O$, and/or $K_2O$, and alkali metal halides, such as LiF, NaF, CsF, KF, LiI, NaI, CsI, KI, and/or RbI. In an embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), and/or $Ba_xCa_{1-x}O$ (0<x<1). In an embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$ and $TbF_3$. In an embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes the organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combination thereof may be homogeneously or non-homogeneously dispersed in a matrix including the organic material.

For example, the electron injection layer may include a co-deposition material of KI and Yb or a co-deposition material of RbI and Yb. For example, the weight ratio of KI and Yb in the co-deposition material of KI and Yb may be from 1:9 to 9:1. For example, the weight ratio of RbI and Yb in the co-deposition material of RbI and Yb may be from 1:9 to 9:1.

A thickness of the electron injection layer may be in a range of about 1 Å to about 100 Å, for example, about 3 Å to about 90 Å. When the thickness of the electron injection layer is within the ranges described above, the electron injection layer may have satisfactory electron injection characteristics without a substantial increase in driving voltage.

[Second Electrode 190]

As described above, the light-emitting device 100 includes a second electrode 190 opposite the first electrode 110. The second electrode 190 is the same as described above. For example, the second electrode 190 may be a cathode which is an electron injection electrode, and in this regard, a material for forming the second electrode 190 may be selected from a metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), ytterbium (Yb), silver-magnesium (Ag—Mg), silver-ytterbium (Ag—Yb), magnesium-indium (Mg—In), ITO, and IZO, but embodiments of the present disclosure are not limited thereto.

The second electrode 190 may be a transmissive electrode, a semi-transmissive electrode, or a reflective electrode.

The second electrode 190 may have a single-layered structure having a single layer or a multi-layered structure including two or more layers. For example, the second electrode may have a structure in which a layer including Ag—Mg and a layer including Yb are stacked.

Hereinbefore, the light-emitting device according to an embodiment has been described in connection with FIG. 2, but embodiments of the present disclosure are not limited thereto.

The layers constituting the light-emitting device may be formed in a certain region by utilizing one or more suitable methods selected from vacuum deposition, spin coating, casting, Langmuir-Blodgett (LB) deposition, ink-jet printing, laser-printing, and laser-induced thermal imaging.

When each layer is formed by the vacuum deposition method, the deposition conditions include, for example, a deposition temperature of about 100° C. to about 500° C., a vacuum degree of about $10^{-8}$ torr to about $10^{-3}$ torr, and a vacuum degree of about 0.01 Å/sec to about 100 Å/sec. The deposition conditions may be selected from these ranges in consideration of a material to be included in a layer to be formed and the structure of a layer to be formed.

When each layer is formed by the spin coating method, the coating conditions include, for example, a coating speed of about 2000 rpm to about 5000 rpm and a heat treatment temperature of about 80° C. to about 200° C. The coating conditions may be selected from these ranges in consideration of a material to be included in a layer to be formed and the structure of a layer to be formed.

[Display Apparatus]

The light-emitting device may be included in a display apparatus including a thin-film transistor. The thin-film transistor may include a source electrode, a drain electrode, and an activation layer (e.g., an active layer), wherein any one of the source electrode and the drain electrode may be electrically connected to the first electrode of the light-emitting device.

The thin-film transistor may further include a gate electrode, a gate insulation layer, and/or the like.

The active layer may include crystalline silicon, amorphous silicon, organic semiconductor, oxide semiconductor, and/or the like, but embodiments of the present disclosure are not limited thereto.

The display apparatus may further include a sealing portion (e.g., a sealing layer) for sealing the light-emitting device. The sealing portion may allow an image from the light-emitting device to be implemented (e.g., to be displayed) and may block outside air and moisture from penetrating into the light-emitting device. The sealing portion may be a sealing substrate including a transparent glass or a plastic substrate. The sealing portion may be a thin film encapsulation layer including a plurality of organic layers and/or a plurality of inorganic layers. When the sealing part is a thin-film encapsulation layer, the entire flat display apparatus may be flexible.

[Optical Member and Apparatus]

According to one or more embodiments, an optical member including the quantum rod as described above is provided.

The optical member may be a color conversion member.

The color conversion member may include a substrate and a pattern layer formed on the substrate.

The substrate may be a substrate constituting the color conversion member, or may be a region of various suitable apparatuses (for example, a display apparatus) in which the color conversion member is located. That is, the substrate may be part of only the color conversion member, or may be a material shared with various suitable apparatuses (for example, a display apparatus) in the region on which the color conversion member is located. The substrate may be glass, silicon (Si), silicon oxide (SiOx), or a polymer substrate, and the polymer substrate may be polyethersulfone (PES) or polycarbonate (PC).

The pattern layer may include a quantum rod in the form of a thin film. For example, the pattern layer may be a thin-film quantum rod. That is, the pattern layer may be a thin film formed of quantum rods.

The color conversion member including the substrate and the pattern layer may further include a partition wall or a black matrix formed between pattern layers. That is, the color conversion member may include a plurality of pattern layers with a partition wall or a black matrix formed therebetween. Meanwhile, the color conversion member may further include a color filter to further improve light conversion efficiency.

The color conversion member may include a red pattern layer capable of emitting red light, a green pattern layer capable of emitting green light, a blue pattern layer capable of emitting blue light, or any combination thereof. The red pattern layer, the green pattern layer and/or the blue pattern layer may be implemented by controlling the components, compositions and/or structure of a nanoparticle in the quantum rod.

According to another embodiment of the present disclosure, an apparatus including the quantum rod (or, an optical member including the quantum rod) is provided.

The apparatus may further include a light source, and the quantum rod (or an optical member including the quantum rod) may be located in the path of light emitted from the light source.

The light source may emit blue light, red light, green light, or white light. For example, the light source may emit blue light.

The light source may be an organic light-emitting device OLED or a light-emitting diode (LED).

The light emitted from the light source as described above may be photoconverted by nanoparticles in the quantum rod while passing through the quantum rod. Accordingly, because of the quantum rod, light having a wavelength that is different from that of the light emitted from the light source, may be emitted.

The apparatus may be a display apparatus, a lighting apparatus, or the like.

[General Definition of Substituents]

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle and/or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle and/or at the terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms as the remaining ring-forming atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms as the remaining ring-forming atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms as the remaining ring-forming atom. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, a carbazolyl group, a dibenzofuranyl group and a dibenzothiofuranyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "monovalent non-aromatic condensed polycyclic group" as used herein refers to a monovalent group having two or more rings condensed with each other, only carbon atoms as ring-forming atoms (for example, having 8 to 60 carbon atoms), and no aromaticity in its entire molecular structure (e.g., the molecular structure as a whole does not have aromaticity). A non-limiting example of the monovalent non-aromatic condensed polycyclic group is a fluorenyl group and an adamantyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, having 1 to 60 carbon atoms), as a ring-forming atom, and no aromaticity in its entire molecular structure (e.g., the molecular structure as a whole does not have aromaticity). An example of the monovalent non-aromatic condensed heteropolycyclic group is a carbazolyl group and 9H-xanthenyl group. The term "divalent non-aromatic condensed heteropolycyclic group" as used herein refers to a divalent group having the same structure as the monovalent non-aromatic condensed heteropolycyclic group.

The term "$C_4$-$C_{60}$ carbocyclic group" as used herein refers to a monocyclic or polycyclic group that includes only 4 to 60 carbon atoms as a ring-forming atom. The $C_4$-$C_{60}$ carbocyclic group may be an aromatic carbocyclic group or a non-aromatic carbocyclic group. The $C_4$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_4$-$C_{60}$ carbocyclic group may be a trivalent group or a quadrivalent group.

The term "$C_2$-$C_{60}$ heterocyclic group" as used herein refers to a group having the same structure as the $C_4$-$C_{60}$ carbocyclic group, except that as a ring-forming atom, at least one heteroatom selected from N, O, Si, P, and S is utilized in addition to carbon atoms (the number of carbon atoms may be in a range of 2 to 60).

In the present specification, at least one substituent of the substituted $C_4$-$C_{60}$ carbocyclic group, the substituted $C_2$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_6$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, *', and *'', as used herein, unless defined otherwise, each refer to a binding site to a neighboring atom in a corresponding formula.

Hereinafter, a compound according to embodiments and a light-emitting device according to embodiments will be described in more detail with reference to the Examples.

EXAMPLES

Evaluation Example

The highest occupied molecular orbital (HOMO) energy level, lowest unoccupied molecular orbital (LUMO) energy level, and bond dissociation energy (B.D.E) of each of ligands 1 to 4 and each of liquid crystal molecules A to C were evaluated utilizing the Gaussian 09 program with the molecular structure optimization obtained by B3LYP-based density functional theory (DFT), and results thereof are shown in Table 1 and Table 2.

Ligand 1 to Ligand 4

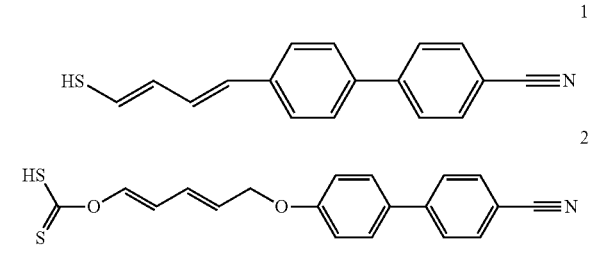

-continued

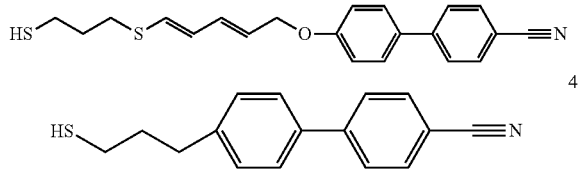

3

Comparative Example A

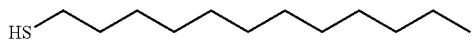

Comparative Example B

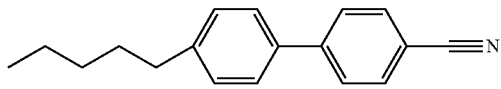 [SMILES: CCCCCc1ccc(-c2ccc(C#N)cc2)cc1]

Comparative Example C

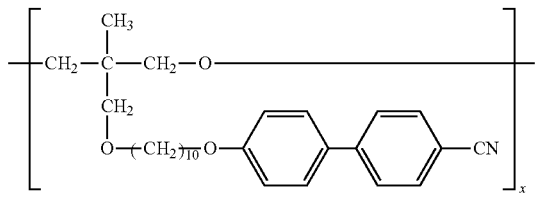

TABLE 1

|  | Comparative Example A | Comparative Example B | Comparative Example C | ligand 1 |
|---|---|---|---|---|
| HOMO energy level (eV) | −6.382 | −6.55 | −6.18 | −5.75 |
| LUMO energy level (eV) | 0.804 | −1.83 | −1.75 | −2.25 |
| B.D.E(eV) Anion | 1.3 to 4.9 | 1.9 to 4.0 | up to 3.97 | 2.6 to 5.0 |
| Neutron | 3.1 to 4.0 | 3.0 to 5.9 | up to 5.95 | 3.6 to 5.9 |
| Cation | 2.0 to 2.9 | 2.0 to 5.9 | up to 6.29 | 5.3 to 9.0 |

TABLE 2

|  | ligand 2 | ligand 3 | ligand 4 |
|---|---|---|---|
| HOMO energy level (eV) | −6.32 | −6.02 | −6.64 |
| LUMO energy level (eV) | −2.32 | −1.76 | −1.90 |
| B.D.E(eV) Anion | — | −0.3 to 4.6 | −1.3 to 4.1 |
| Neutron | 1.6 to 5.9 | 1.6 to 5.9 | 2.9 to 5.8 |
| Cation | 0.6 to 7.6 | at least 0.7 | 1.9 to 6.0 |

Figure 5:
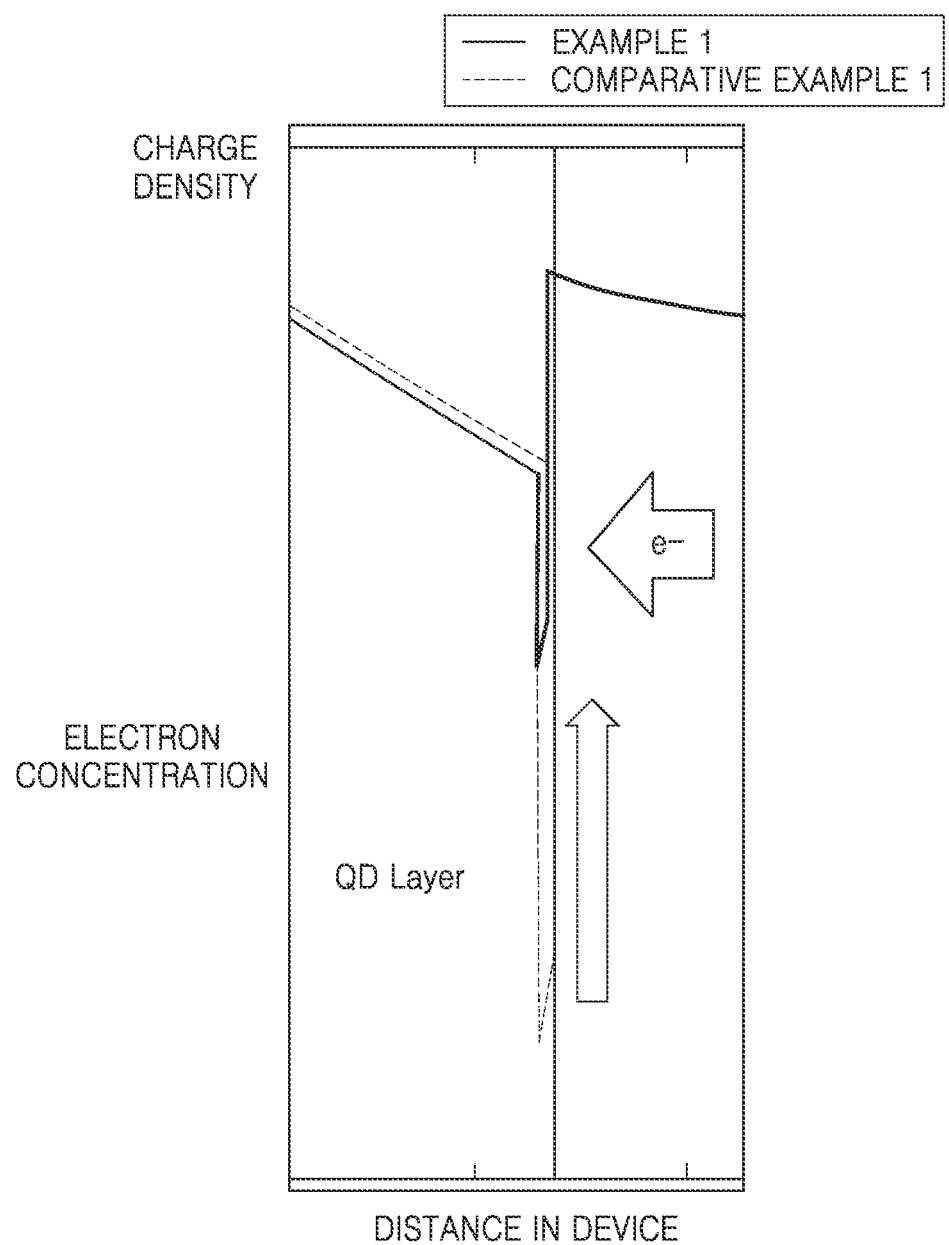
FIG. 5 is a diagram showing electron injection characteristics of Example 1 and Comparative Example 1.

In addition, hole/electron injection characteristics of the emission layer (Example 1) including the quantum rod to which ligand 1 was applied and the emission layer (Comparative Example 1) including the quantum rod to which Comparative Example A was applied, were simulated. Results thereof are shown in FIG. 5.

Figure 4:
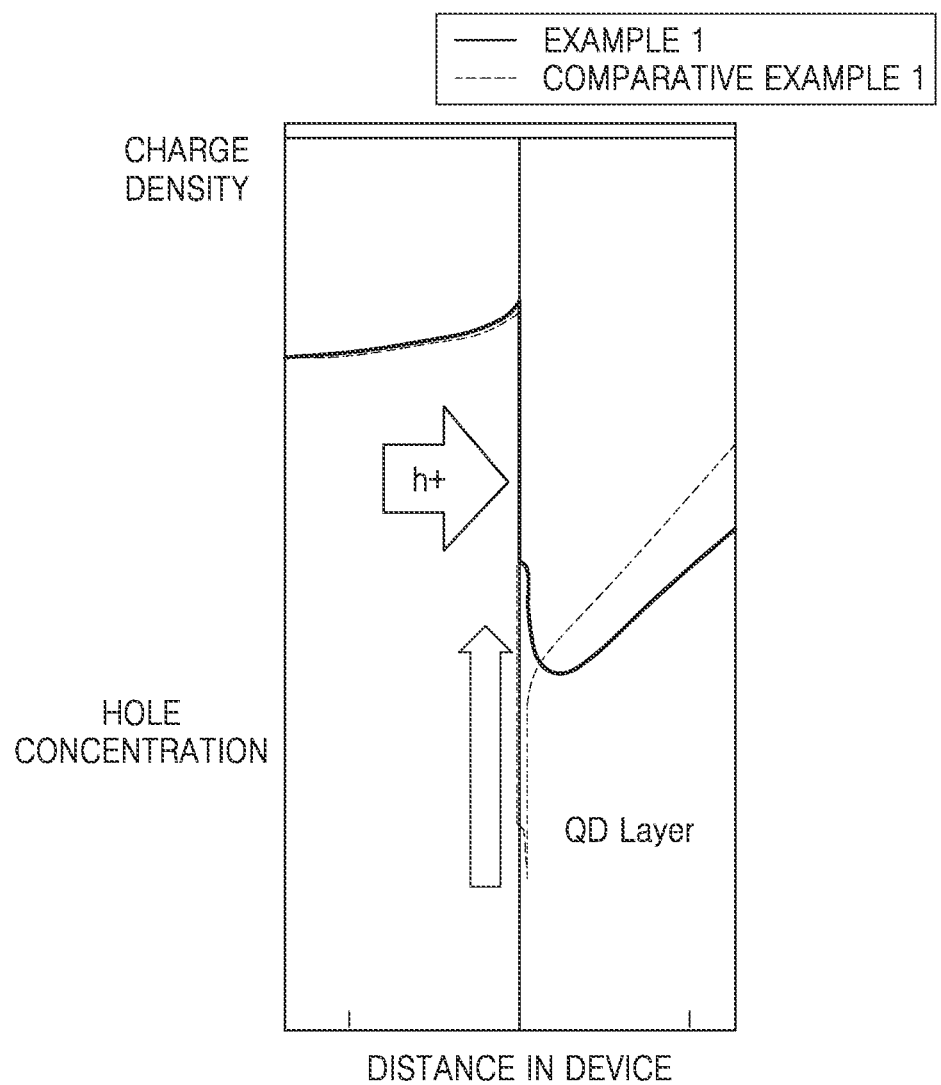
FIG. 4 is a diagram showing hole injection characteristics of Example 1 and Comparative Example 1.

Referring to Tables 1 and 2, in the case of ligands 1 to 3 according to the present disclosure, the energy band gap is narrower than those of Comparative Example A to C. Referring to FIGS. 4 and 5, when a device is manufactured utilizing a quantum rod, in the case of ligands 1 to 3, the injection of charges may easily occur compared to the case of Comparative Examples A to C, and thus, when charges are injected, the bond dissociation energy value in an anion and cation structure is high and thus the structural stability may be obtained.

In addition, in the case of ligand 4, the energy band gap is similar to that of Comparative Example B. This is because the basic structure of the molecule is similar to each other. Nonetheless, ligand 4 may adhere to the nanoparticle well due to the inclusion of —SH at the anchoring group region. Therefore, when a device utilizing a quantum rod to which ligand 4 is applied is fabricated, desired (e.g., excellent) charge injection characteristics and structural stability may be exhibited.

In the quantum rod, a liquid crystal ligand is linked to the surface of a nanoparticle, so that the quantum rod may be uniformly oriented in a plane, and thus, the out-coupling efficiency can be improved by about 2 times or more, and device stability may be improved, resulting in high efficiency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A quantum rod comprises:
   a nanoparticle; and
   at least one liquid crystal ligand linked to a surface of the nanoparticle, the liquid crystal ligand being represented by Formula 1:

$R_1\text{-}(L_1)_{b1}\text{-}(A_1)_{a1}\text{-}(L_2)_{b2}\text{-}(A_2)_{a2}\text{-}(L_3)_{b3}\text{-}T_1$    Formula 1 wherein, in Formula 1,
   $A_1$ and $A_2$ are each independently a substituted or unsubstituted $C_3$-$C_{60}$ carbocyclic group or a substituted or unsubstituted $C_1$-$C_{60}$ heterocyclic group,
   a1 and a2 are each independently an integer from 1 to 6,
   $L_1$ to $L_3$ may each independently be selected from *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S*', *—SCF$_2$*', *—(CH$_2$)$_{n1}$*', *—CF$_2$CH$_2$—*', *—CH$_2$CF$_2$—*', *—(CF$_2$)$_{n1}$*', *—CH=CH—*', *—CF=CF—*', *—C≡C—*', *—CH=CH—C(=O)O—*', *—OC(=O)—CH=CH—*', *—C(Q$_1$)(Q$_2$)*', *—CH(—(S$_p$)$_{c1}$—P$_3$)—*', *—CH$_2$CH(—(S$_p$)$_{c1}$—P$_3$)*', *—CH(—(S$_p$)$_{c1}$—P$_3$)CH(—(S$_p$)$_{c2}$—P$_3$)—*', *—O—(CH$_2$)—O(C=O)—(CH$_2$)$_{n2}$—*', *—S(=O)(Q$_1$)-*', *—S(=O)$_2$—*', *—P(=O)(Q$_1$)-*', *—P(=O)$_2$—*', *—P(=S)(Q$_1$)-*', and *—P(=S)$_2$—*',
   b1 to b3 may each independently be an integer from 0 to 6, n1 may be an integer from 1 to 4, n2 may be an integer from 0 to 2, $S_p$ may be a spacer group or a single bond, c1 and c2 may each independently be an integer from 1 to 4, $R_1$ may be selected from *—(O—Si$(R_a)(R_b))_{d1}$—O—Si$(R_c)(R_d)(R_e)$, *—P(=O)$(OR_a)_2$, *—O$(R_a)$, *—C(=O)$(OR_a)$, *—S$(R_a)$, and *—N$(R_a)(R_b)$, $R_a$ to $R_e$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, d1 is an integer from 0 to 6, $T_1$ is selected from a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, and at least one substituent of the substituted $C_3$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, and the substituted $C_1$-$C_{60}$ alkoxy group is selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —NCO, —NCS, —OCN, —SCN, —C(=O)N$(Q_{11})_2$, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, and —P(=O)$(Q_{11})(Q_{12})$, wherein $Q_1$ to $Q_2$ and $Q_{11}$ to $Q_{13}$ are each independently selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to a neighboring atom, and wherein when b1 is two or greater and one or more $L_1$ is *—$(CH_2)_{n1}$—*', a sum of n1 in the one or more $L_1$ is four or less.

2. The quantum rod of claim 1, wherein $A_1$ and $A_2$ are each independently selected from:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group, each substituted with at least one selected from deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a pyridinyl group, a pyrazinyl group, a pyrimidinyl group, a pyridazinyl group, a quinolinyl group, an isoquinolinyl group, a benzofuranyl group, a benzothiophenyl group, —NCO, —NCS, —OCN, —SCN, —C(=O)N$(Q_{11})_2$, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, and —P(=O)$(Q_{11})(Q_{12})$, and wherein $Q_{11}$ to $Q_{13}$ are each independently selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

3. The quantum rod of claim 1, wherein *-$(A_1)_{a1}$-*' and *-$(A_2)_{a2}$-*' are each independently a group represented by one of Formulae A-1 to A-21:

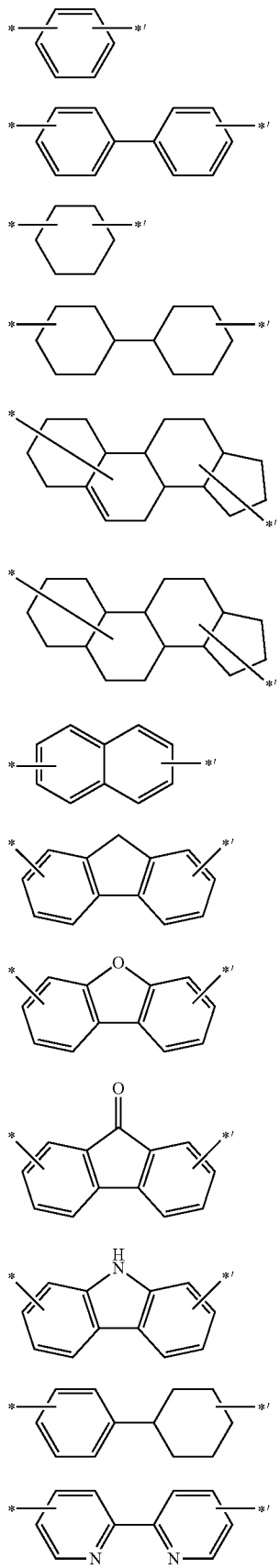
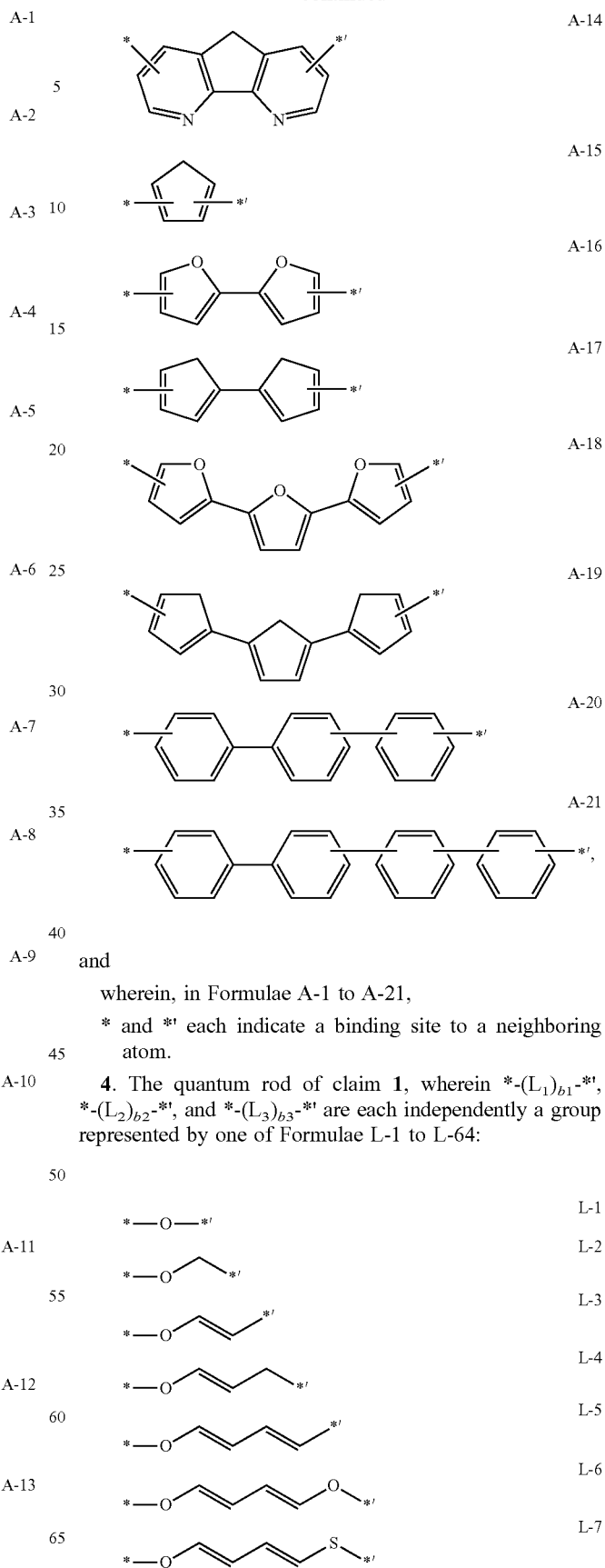
and
wherein, in Formulae A-1 to A-21,
\* and \*' each indicate a binding site to a neighboring atom.
4. The quantum rod of claim 1, wherein *-$(L_1)_{b1}$-*', *-$(L_2)_{b2}$-*', and *-$(L_3)_{b3}$-*' are each independently a group represented by one of Formulae L-1 to L-64:

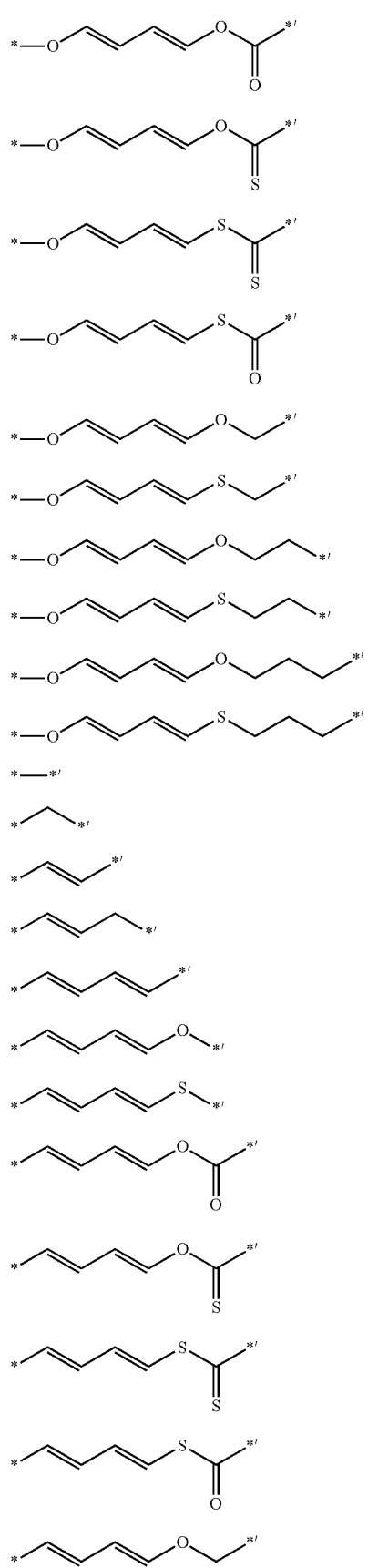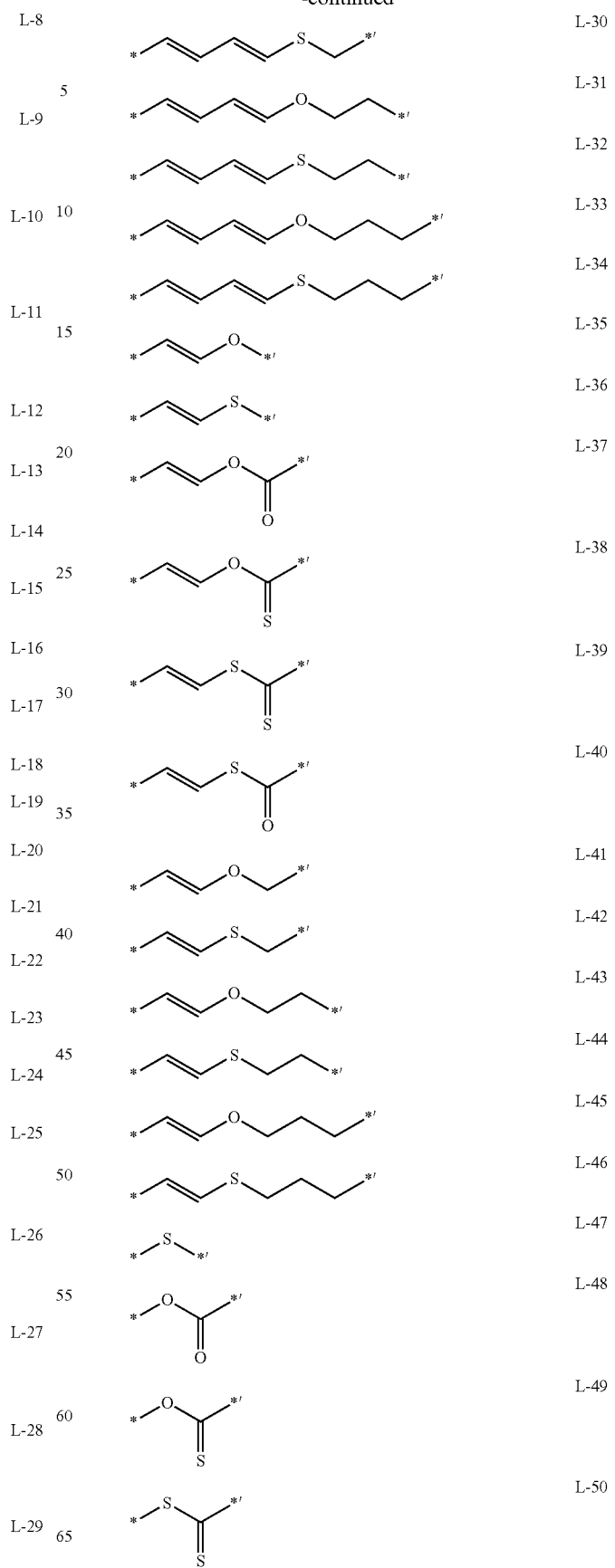

-continued

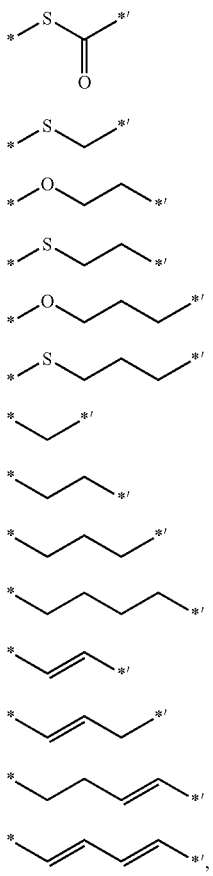

L-51
L-52
L-53
L-54
L-55
L-56
L-57
L-58
L-59
L-60
L-61
L-62
L-63
L-64 and
wherein, in Formulae L-1 to L-64,
* and *' each indicate a binding site to a neighboring atom.

5. The quantum rod of claim 1, wherein $R_1$ is *—S($R_a$), $R_a$ is selected from: hydrogen, deuterium, —F, —Cl, —Br, —I, a hydroxyl group, a cyano group, a nitro group, an amino group, an amidino group, a hydrazine group, a hydrazone group, a $C_1$-$C_{20}$ alkyl group, a $C_2$-$C_{20}$ alkenyl group, a $C_2$-$C_{20}$ alkynyl group, and a $C_1$-$C_{20}$ alkoxy group; and a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a $C_1$-$C_{20}$ alkyl group, a $C_2$-$C_{20}$ alkenyl group, a $C_2$-$C_{20}$ alkynyl group, and a $C_1$-$C_{20}$ alkoxy group.

6. The quantum rod of claim 1, wherein the at least one liquid crystal ligand is at least one selected from ligand 1 to ligand 4:

1

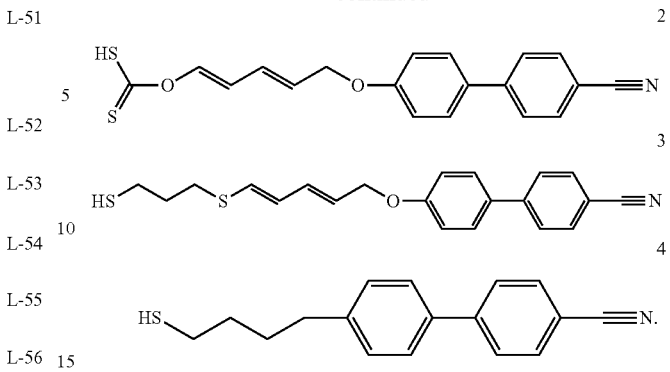

2

3

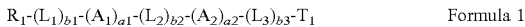

4

7. A quantum rod comprises:
a nanoparticle; and
at least one liquid crystal ligand linked to a surface of the nanoparticle, the liquid crystal ligand being represented by Formula 1:

$$R_1\text{-}(L_1)_{b1}\text{-}(A_1)_{a1}\text{-}(L_2)_{b2}\text{-}(A_2)_{a2}\text{-}(L_3)_{b3}\text{-}T_1 \quad \text{Formula 1}$$

wherein, in Formula 1,
$A_1$ and $A_2$ are each independently a substituted or unsubstituted $C_3$-$C_{60}$ carbocyclic group or a substituted or unsubstituted $C_1$-$C_{60}$ heterocyclic group,
a1 and a2 are each independently an integer from 1 to 6,
$L_1$ to $L_3$ may each independently be selected from *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S*', *—SCF$_2$—*', *—(CH$_2$)$_{n1}$*', *—CF$_2$CH$_2$—*', *—CH$_2$CF$_2$—*', *—(CF$_2$)$_{n1}$*', *—CH=CH—*', *—CF=CF—*', *—C≡C—*', *—CH=CH—C(=O)O—*', *—OC(=O)—CH=CH—*', *—C(Q$_1$)(Q$_2$)*', *—CH(—(S$_p$)$_{c1}$—P$_3$)—*', *—CH$_2$CH(—(S$_p$)$_{c1}$—P$_3$)*', *—CH(—(S$_p$)$_{c1}$—P$_3$)CH(—(S$_p$)$_{c2}$—P$_3$)—*', *—O—(CH$_2$)—O(C=O)—(CH$_2$)$_{n2}$—*', *—S(=O)(Q$_1$)-*', *—S(=O)$_2$—*', *—P(=O)(Q$_1$)-*', *—P(=O)$_2$—*', *—P(=S)(Q$_1$)-*', and *—P(=S)$_2$—*',
b1 to b3 may each independently be an integer from 0 to 6,
n1 may be an integer from 1 to 4, n2 may be an integer from 0 to 2,
$S_p$ may be a spacer group or a single bond,
c1 and c2 may each independently be an integer from 1 to 4,
$R_1$ may be selected from *—(O—Si($R_a$)($R_b$))$_{d1}$—O—Si($R_c$)($R_d$)($R_e$), *—P(=O)(OR$_a$)$_2$, *—O($R_a$), *—C(=O)(OR$_a$), *—S($R_a$), and *—N($R_a$)($R_b$),
$R_a$ to $R_e$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group,
d1 is an integer from 0 to 6,
$T_1$ is selected from a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, and at least one substituent of the substituted $C_3$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, and the substituted $C_1$-$C_{60}$ alkoxy group is selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), wherein $Q_1$ to $Q_2$ and $Q_{11}$ to $Q_{13}$ are each independently selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to a neighboring atom, and wherein the nanoparticle is a perovskite compound or has a core-shell structure comprising a core and a shell, the core comprising a first semiconductor crystal and the shell comprising a second semiconductor crystal.

8. The quantum rod of claim 7, wherein the first semiconductor crystal and the second semiconductor crystal each independently comprise a Group 12-Group 16-based compound, a Group 13-Group 15-based compound, a Group 14-Group 16-based compound, a Group 14-based compound, a Group 11-Group 13-Group 16-based compound, a Group 11-Group 12-Group 13-Group 16-based compound, or any combination thereof.

9. The quantum rod of claim 7, wherein the first semiconductor crystal and the second semiconductor crystal each independently comprise:

CdS, CdSe, CdTe, ZnS, ZnSe, ZnTe, ZnO, HgS, HgSe, HgTe, MgS, MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe; CdZnSeS, CdZnSeTe, CdZnSTe, CdHgSeS, CdHgSeTe, CdHgSTe, HgZnSeS, HgZnSeTe, HgZnSTe,

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP; GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP,

SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, SnPbSTe; Si, Ge, SiC, SiGe,

AgInS, AgInS$_2$, CuInS, CuInS$_2$, CuGaO$_2$, AgGaO$_2$, AgAlO$_2$, or any combination thereof.

10. The quantum rod of claim 7, wherein the first semiconductor crystal comprises GaN, GaP, GaAs, GaSb, AlN, AlIP, AlAs, AlSb, InN, InP, InAs, InSb, GaNP, GaNAs, GaNSb, GaPAs, GaPSb, AlNP, AlNAs, AlNSb, AlIPAs, AlIPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor crystal comprises CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

11. The quantum rod of claim 1, wherein an average diameter of the nanoparticle is from about 5 nm to about 100 nm, and an aspect ratio thereof is from about 1.1:1 to about 20:1.

12. The quantum rod of claim 1, wherein the nanoparticle is a one-dimensional particle having a length or a two-dimensional particle in a form of a plate.

13. A light-emitting device comprising:
a first electrode;
a second electrode facing the first electrode; and
an emission layer between the first electrode and the second electrode,
wherein the emission layer comprises the quantum rod of claim 1.

14. The light-emitting device of claim 13, wherein the emission layer further comprises a substrate, and a plurality of quantum rods are aligned in an identical orientation on the substrate.

15. The light-emitting device of claim 14, wherein the substrate has a groove or comprises an alignment layer.

16. An optical member comprising the quantum rod of claim 1.

17. The optical member of claim 16, wherein the optical member is a color conversion member.

18. An apparatus comprising a quantum rod,
wherein the quantum rod comprises:
a nanoparticle; and
at least one liquid crystal ligand linked to a surface of the nanoparticle, the liquid crystal ligand being represented by Formula 1:

$$R_1\text{-}(L_1)_{b1}\text{-}(A_1)_{a1}\text{-}(L_2)_{b2}\text{-}(A_2)_{a2}\text{-}(L_3)_{b3}\text{-}T_1 \quad \text{Formula 1}$$

wherein, in Formula 1, $A_1$ and $A_2$ are each independently a substituted or unsubstituted $C_3$-$C_{60}$ carbocyclic group or a substituted or unsubstituted $C_1$-$C_{60}$ heterocyclic group, a1 and a2 are each independently an integer from 1 to 6, $L_1$ to $L_3$ may each independently be selected from *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S*', *—SCF$_2$*',

*—$(CH_2)_{n1}$—*', *—$CF_2CH_2$—*', *—$CH_2CF_2$—*', *—$(CF_2)_{n1}$—*', *—CH=CH—*', *—CF=CF—*', *—C≡C—*', *—CH=CH—C(=O)O—*', *—OC(=O)—CH=CH—*', *—$C(Q_1)(Q_2)$—*', *—CH(—$(S_p)_{c1}$—$P_3$)—*', *—$CH_2$CH(—$(S_p)_{c1}$—$P_3$)—*', *—CH(—$(S_p)_{c1}$—$P_3$)CH(—$(S_p)_{c2}$—$P_3$)—*', *—O—$(CH_2)$—O(C=O)—$(CH_2)_{n2}$—*', *—$S(=O)(Q_1)$—*', *—$S(=O)_2$—*', *—$P(=O)(Q_1)$-*', *—$P(=O)_2$—*', *—$P(=S)(Q_1)$-*', and *—$P(=S)_2$—*', b1 to b3 may each independently be an integer from 0 to 6, n1 may be an integer from 1 to 4, n2 may be an integer from 0 to 2, $S_p$ may be a spacer group or a single bond, c1 and c2 may each independently be an integer from 1 to 4, $R_1$ may be selected from *—$(O—Si(R_a)(R_b))_{d1}$—O—Si$(R_c)(R_d)(R_e)$, *—$P(=O)(OR_a)_2$, *—$O(R_a)$, *—$C(=O)(OR_a)$, *—$S(R_a)$, and *—$N(R_a)(R_b)$, $R_a$ to $R_e$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, d1 is an integer from 0 to 6, $T_1$ is selected from a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, and a substituted or unsubstituted $C_1$-$C_{60}$ alkoxy group, and at least one substituent of the substituted $C_3$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, and the substituted $C_1$-$C_{60}$ alkoxy group is selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —NCO, —NCS, —OCN, —SCN, —$C(=O)N(Q_{11})_2$, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$, and wherein $Q_1$ to $Q_2$ and $Q_{11}$ to $Q_{13}$ are each independently selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to a neighboring atom.

19. The apparatus of claim 18, further comprising a light source to emit light, wherein the quantum rod is located in a path of light emitted from the light source.

20. The apparatus of claim 19, wherein the light source is an organic light-emitting device (OLED) or a light-emitting diode (LED).

* * * * *